United States Patent [19]
Chung et al.

[11] Patent Number: 6,097,624
[45] Date of Patent: Aug. 1, 2000

[54] METHODS OF OPERATING FERROELECTRIC MEMORY DEVICES HAVING RECONFIGURABLE BIT LINES

[75] Inventors: Yeon-bae Chung; Byung-gil Jeon, both of Kyungki-do, Rep. of Korea

[73] Assignee: Samsung Electronics Co., Ltd., Rep. of Korea

[21] Appl. No.: 09/429,860

[22] Filed: Oct. 29, 1999

Related U.S. Application Data

[62] Division of application No. 08/932,729, Sep. 17, 1997, Pat. No. 5,978,250.

[51] Int. Cl.[7] .................................................. G11C 11/22
[52] U.S. Cl. ........................................... 365/145; 365/210
[58] Field of Search ................................... 365/145, 149, 365/202, 210

[56] References Cited

U.S. PATENT DOCUMENTS

| | | | |
|---|---|---|---|
| 5,038,323 | 8/1991 | Schwee ..................................... | 365/145 |
| 5,262,982 | 11/1993 | Brassington ............................. | 365/145 |
| 5,273,927 | 12/1993 | Gnadinger ................................. | 437/52 |
| 5,300,799 | 4/1994 | Nakamura et al. ...................... | 257/295 |
| 5,345,414 | 9/1994 | Nakamura ............................... | 365/145 |
| 5,350,705 | 9/1994 | Brassington et al. ................... | 257/295 |

(List continued on next page.)

FOREIGN PATENT DOCUMENTS

| | | |
|---|---|---|
| 0359404A2 | 3/1990 | European Pat. Off. . |
| 0749127A2 | 12/1996 | European Pat. Off. . |
| 0759620A2 | 2/1997 | European Pat. Off. . |
| 0766253A2 | 4/1997 | European Pat. Off. . |

OTHER PUBLICATIONS

The Patent Office, Search Report Under Section 17(5), British Patent Office, dated Oct. 16, 1997.

*Primary Examiner*—Richard Elms
*Assistant Examiner*—Van Thu Nguyen
*Attorney, Agent, or Firm*—Myers Bigel Sibley & Sajovec

[57] ABSTRACT

Integrated circuit memory devices contain a ferroelectric random access memory cell array and a ferroelectric reference cell array electrically coupled to a plurality of bit lines, a sense amplifier and a plate/bit line selection switch, coupled to the plurality of bit lines, for configuring selected bit lines as plate lines by selectively coupling first ones of the plurality of bit lines to the sense amplifier and by selectively coupling second ones of the plurality of bit lines to a plate line, in response to a column select signal. The inclusion of a selection switch and related driving circuits eliminates the need to provide extra dedicated plate lines because each of the bit lines can be at least temporarily configured as a plate line during reading and writing operations. The reference cell array also preferably comprises a plurality of ferroelectric reference cells which each comprise first and second access transistors therein and first and second ferroelectric capacitors therein which store complementary states. During a reading operation, the complementary data stored in the first and second ferroelectric reference capacitors is simultaneously provided to a portion of a first bit line which is electrically connected to a second input of a sense amplifier. Data in a memory cell within the array is also provided to another portion of the first bit line which is electrically connected to a first input of the sense amplifier. The sense amplifier is then activated to amplify a difference in potential between the different portions of the first bit line as complementary signals and then the signals are provided as output data.

9 Claims, 27 Drawing Sheets

U.S. PATENT DOCUMENTS

| | | | |
|---|---|---|---|
| 5,357,460 | 10/1994 | Yusuki et al. | 365/145 |
| 5,371,699 | 12/1994 | Larson | 365/145 |
| 5,373,463 | 12/1994 | Jones, Jr. | 365/145 |
| 5,400,275 | 3/1995 | Abe et al. | 365/145 |
| 5,412,596 | 5/1995 | Hoshiba | 365/145 |
| 5,414,654 | 5/1995 | Kubota et al. | 365/145 |
| 5,424,975 | 6/1995 | Lowrey et al. | 365/145 |
| 5,487,029 | 1/1996 | Kuroda | 365/145 |
| 5,508,954 | 4/1996 | Mihara et al. | 365/145 |
| 5,541,871 | 7/1996 | Nishimura et al. | 365/145 |
| 5,550,770 | 8/1996 | Kuroda | 365/145 |
| 5,579,257 | 11/1996 | Tai | 365/145 |
| 5,598,366 | 1/1997 | Kraus et al. | 365/145 |
| 5,600,587 | 2/1997 | Koike | 365/145 |
| 5,608,667 | 3/1997 | Osawa | 365/145 |
| 5,615,144 | 3/1997 | Kimura et al. | 365/145 |
| 5,615,145 | 3/1997 | Takeuchi et al. | 365/145 |
| 5,619,470 | 4/1997 | Fukumoto | 365/228 |
| 5,640,030 | 6/1997 | Kenney | 257/296 |
| 5,640,345 | 6/1997 | Okunda et al. | 365/184 |
| 5,675,530 | 10/1997 | Hirano et al. | 365/145 |
| 5,675,536 | 10/1997 | Sim | 365/185.22 |
| 5,675,537 | 10/1997 | Bill et al. | 365/185.22 |
| 5,822,237 | 10/1998 | Wilson et al. | 365/145 |
| 5,852,571 | 12/1998 | Kinney | 365/145 |

METHODS OF OPERATING FERROELECTRIC MEMORY DEVICES HAVING RECONFIGURABLE BIT LINES

This application is a division of Ser. No. 08/932,729 filed Sep. 17, 1997, U.S. Pat. No. 5,978,250.

FIELD OF THE INVENTION

The present invention relates to integrated circuits and more particularly to integrated circuit memory devices and methods of operating integrated circuit memory devices.

BACKGROUND OF THE INVENTION

Ferroelectric random access memory (FRAM) devices are "nonvolatile" memory devices because they preserve data stored therein, even in the absence of a power supply signal. Each memory cell includes a capacitor composed of a ferroelectric material. The ferroelectric capacitor is composed of two conductive layers and a ferroelectric material layer formed therebetween. The ferroelectric materials used for the ferroelectric capacitor are typically Phase III potassium nitrate, bismuth titanate and lead zirconate titanate Pb(Zr, Ti)O$_3$ (PZT). Ferroelectric materials have hysteresis characteristics. Thus, the polarity of the ferroelectric material can be maintained even after interruption of the power supply. Data (e.g., logic 0,1) is stored in the FRAM as the polarity state of the ferroelectric material in each capacitor.

The typical hysteresis characteristics of the ferroelectric material will be described in detail with reference to FIG. 1. A ferroelectric capacitor consists of two conductive layers and a ferroelectric material layer formed therebetween. In FIG. 1, the abscissa represents a voltage V applied across the electrodes of the ferroelectric capacitor, and the ordinate represents an amount of electric charge Q stored in the ferroelectric capacitor. The polarity-electric field (P-E) characteristics of the ferroelectric material is also similar to that of the Q-V characteristics shown in FIG. 1.

Due to the hysteresis characteristic of the ferroelectric capacitor, current passing through a capacitor is changed by the history of the voltage applied thereto. For example, assuming that the S4 state corresponds to data "1", the S1 state corresponds to data "0", the state of the ferroelectric capacitor is transferred from state S4 to state S5 and then to state S6 by application of a negative voltage. During this transfer, the electric charge amount $Q_R$ accumulated in the ferroelectric capacitor is changed to $-Q_R$. At this time, a change of the accumulated charge becomes $-2Q_R$, and accordingly a voltage of a bit line is changed as shown in formula (1):

$$\Delta V_{(1)} = \frac{2Q_R}{C_{BL}}$$

Here, $C_{BL}$ represents an equivalent capacitance of a bit line coupled to the ferroelectric capacitor.

However, in the event the ferroelectric capacitor is in the S1 state corresponding to data "zero", and then a negative voltage is applied, the S1 state is changed to the S6 state and the change in accumulated electric charge is slight. Thus, the change in potential of the bit line is negligible.

The hysteresis characteristic of the ferroelectric capacitor will now be described in more detail as follows. Assuming that an initial state of the ferroelectric capacitor is S1 in FIG. 1, if the voltage applied to the ferroelectric capacitor is increased, the state of the ferroelectric capacitor will transition from state S1 to state S2. The voltage applied to the ferroelectric capacitor in state S2 is typically referred to as the coercive voltage. If the intensity of the voltage applied to the ferroelectric capacitor is increased beyond the coercive voltage, the state of the ferroelectric capacitor will change from state S2 to state S3. In state S3, the ferroelectric capacitor has a first polarization which is typically referred to as a positive polarization. As illustrated by FIG. 1, the removal of the positive voltage from a ferroelectric capacitor in state S3 will cause the capacitor to transition from state S3 to state S4, however, the first polarization state will be maintained. Finally, if the voltage applied to a ferroelectric capacitor in state S4 is made sufficiently negative, the state of the ferroelectric capacitor will transition to state S5 and then to state S6. In state S6, the ferroelectric capacitor has a second polarization which is typically referred to as a negative polarization. As illustrated by FIG. 1, the removal of the negative voltage from a ferroelectric capacitor in state S6 will cause the capacitor to transition from state S6 to state S1, however, the second polarization state will be maintained. As will be understood by those skilled in the art, a ferroelectric capacitor in the first and second polarization states is typically referred to as storing data "1" and data "0", respectively.

The polarization switching speed of a ferroelectric capacitor is approximately $10^{-9}$ sec, and the necessary program time of the ferroelectric capacitor is typically shorter than that of other nonvolatile memory devices such as electrically programmable read only memory (EPROM) devices, electrically erasable and programmable read only memory (EEPROM) devices and flash memory devices. As will be understood by those skilled in the art, the read/write cycle endurance of a ferroelectric capacitor is typically on the order of $10^9$ to $10^{12.}$ Conventional nonvolatile ferroelectric memory devices having ferroelectric capacitors will now be described with reference to FIGS. 2–4. In FIG. 2, a nonvolatile ferroelectric memory device includes nine memory cells. Each memory cell comprises one ferroelectric capacitor. The ferroelectric capacitor is connected between one of row lines R0, R1 and R2 and one of column lines C0, C1 and C2. A memory cell having the ferroelectric capacitor 101 is selected by applying a positive voltage, for example, 5 Volts, to the row line R0 and 0 Volts to the other row lines R1 and R2. At this time, the positive voltage is applied to upper conductive layers of the ferroelectric capacitors 102 and 103 as well as that of the ferroelectric capacitor 101. 0 Volts is applied to the column line C0. Accordingly, 5 Volts is applied across the ends of the selected ferroelectric capacitor 101, which causes the ferroelectric capacitor 101 to be in a first polarization state. At this time, 0 Volts is applied across the ferroelectric capacitor 104 so that the polarization state is not changed. However, a voltage of approximately 2.5 Volts is applied to the respective column lines C1 and C2 so that the voltages applied across the ferroelectric capacitors 102 and 103 should not change polarization states. After completion of a reading operation of the memory cell formed of the ferroelectric capacitor 101, an operation for restoring a state of initial polarization should be performed. Accordingly, 5 Volts is applied to the column line C0 and 0 Volts is applied to the row line R0. Also, 2.5 Volts is applied to the row lines R1 and R2 and 0 Volts is applied to the column lines C1 and C2. Accordingly, the nonvolatile ferroelectric memory device shown in FIG. 2 requires a driving circuit for generating a sequence of various combinational voltages. The driving circuit is complicated and may impede the high speed operation of the memory device. The driving circuit may also require a wide layout area.

FIG. 3 shows another conventional nonvolatile ferroelectric memory device, where a memory cell includes one access transistor and one ferroelectric capacitor. One memory cell is formed in correspondence to an intersection of each of the bit lines BL0, BL1, BL2, . . . , BLn with each of the word lines WL0, WL1, . . . , WLn. In a memory cell 110, a gate of an access transistor 111 is connected to the word line WL0, and a drain is connected to the bit line BL0. A ferroelectric capacitor 112 is connected between a source of the access transistor 111 and a plate line PL0. Plate lines PL0, PL1, . . . , PLn are alternately formed in parallel with the word lines WL0, WL1, . . . , WLn. A method for driving the nonvolatile ferroelectric memory device shown in FIG. 3 is disclosed in an article by T. Sumi, et al. entitled *A 256 kb Nonvolatile Ferroelectric Memory at 3V and 100 ns*, ISSCC Digest of Technical Papers, pp. 268–269, February (1994). In the nonvolatile ferroelectric memory device shown in FIG. 3, ferroelectric capacitors of all memory cells connected to a word line and plate line, as well as the memory cell on the word line and the plate line to be accessed during a reading/writing operation, are exposed to a fatigue cycle. Accordingly, the ferroelectric capacitors deteriorate. Also, a plate voltage is applied to all memory cells corresponding to the same word line during a reading/writing operation, to thereby consume a great deal of active power.

FIG. 4 shows still another conventional nonvolatile ferroelectric memory device, where one memory cell includes one access transistor and one ferroelectric capacitor. One memory cell is formed in correspondence to an intersection of each of the bit lines BL0, BL1, BL2, . . . , BLn with each of the word lines WL0, WL1, . . . , WLn. In the memory cell 120, a gate and a drain of an access transistor 121 are connected to the word line WL0 and the bit line BL0, respectively, and a source is connected to one end of a ferroelectric capacitor 122. Another end of the ferroelectric capacitor 122 is connected to a plate line PL0. Here, the plate lines PL0, PL1, . . . , PLn are alternately formed in parallel with the bit lines BL0, BL1, . . . BLn unlike in FIG. 3. A method for driving the nonvolatile ferroelectric memory device shown in FIG. 4, like in FIG. 3, is disclosed in the above Sumi et al. article. Unfortunately, the inclusion of the plate lines between alternating bit lines may impede the manufacturing process and reduce integration levels.

SUMMARY OF THE INVENTION

It is therefore an object of the present invention to provide improved integrated circuit memory devices and methods of operating same.

It is another object of the present invention to provide nonvolatile integrated circuit memory devices which can be highly integrated by eliminating dedicated bit lines and methods of operating same.

It is still another object of the present invention to provide nonvolatile integrated circuit memory devices having ferroelectric memory cells therein which can be read nondestructively and methods of operating same.

It is still a further object of the present invention to provide nonvolatile integrated circuit memory devices having high long term reliability and methods of operating same.

These and other objects, features and advantages of the present invention are provided by integrated circuit memory devices which contain a ferroelectric random access memory cell array and a ferroelectric reference cell array electrically coupled to a plurality of bit lines, a sense amplifier and means, coupled to the plurality of bit lines, for configuring selected bit lines as plate lines by selectively coupling first ones of the plurality of bit lines to the sense amplifier and by selectively coupling second ones of the plurality of bit lines to a plate line, in response to a column select signal. The means for configuring selected bit lines preferably comprises a plate/bit line selection switch. Thus, according to the present invention, it is not necessary to provide extra dedicated plate lines because each of the bit lines can be at least temporarily configured as a plate line during reading and writing operations. The reference cell array also preferably comprises a plurality of ferroelectric reference cells which each comprise first and second access transistors therein and first and second ferroelectric capacitors therein which store complimentary states. For example, a first access transistor and first ferroelectric reference capacitor are preferably connected in series between first and second adjacent bit lines, and a second access transistor and second ferroelectric reference capacitor are also preferably connected in series between the first and second bit lines. During a reading operation, the complimentary data stored in the first and second ferroelectric reference capacitors is simultaneously provided to a portion of a first bit line which is electrically connected to a second input of a sense amplifier. During the reading operation, data in a memory cell within the array is also provided to another portion of the first bit line which is electrically connected to a first input of the sense amplifier. The sense amplifier is then activated to amplify a difference in potential between the different portions of the first bit line as complimentary signals and then the complimentary signals are provided as output data.

According to another embodiment of the present invention, a ferroelectric random access memory device is provided which comprises first and second bit lines which each contain first, second, third and fourth bit line segments. A first ferroelectric data memory cell is provided and is electrically connected between the first segments of the first and second bit lines. A second ferroelectric data memory cell is also electrically connected between the fourth segments of the first and second bit lines. According to a preferred aspect of the present invention, a first reference circuit is provided which contains first and second reference memory cells electrically coupled in parallel between the third segments of the first and second bit lines. In addition, a second reference circuit is provided which contains third and fourth reference memory cells electrically coupled in parallel between the second segments of the first and second bit lines. First and second isolation switches are also electrically coupled in series between the first and second segments of the first and second bit lines, respectively, and third and fourth isolation switches are electrically coupled in series between the third and fourth segments of the first and second bit lines, respectively. First and second sense amplifiers are also electrically coupled in series between the second and third segments of the first and second bit lines, respectively. In this embodiment, a first bit line equalizing circuit is provided to increase the reliability of the reading operation. The first bit line equalizing circuit is electrically coupled between the fourth segments of the first and second bit lines. A second bit line equalizing circuit is also electrically coupled between the first segments of the first and second bit lines. To increase integration levels, a third ferroelectric data memory cell is electrically connected between the first segments of the first and second bit lines and a fourth ferroelectric data memory cell electrically connected between the fourth segments of the first and second bit lines. And, a third reference circuit containing first and second reference memory cells is electrically coupled in parallel between the third segments of the first and second bit lines, and a fourth reference circuit containing third and fourth reference memory cells is electrically coupled in parallel between the second segments of the first and second bit lines.

According to another aspect of the present invention, a preferred method of operating a ferroelectric memory device is provided. In particular, in an integrated circuit memory device containing a data memory cell electrically connected between first and second upper bit lines, a reference circuit containing first and second reference memory cells electrically connected between first and second lower bit lines and a sense amplifier electrically coupled between the first upper and lower bit lines, a preferred method of operating the memory device comprises the steps of reading the state of the data memory cell onto the first upper bit line and reading the states of the first and second reference memory cells simultaneously onto the first lower bit line and then amplifying a difference in potential between the first upper bit line and first lower bit lines. The amplifying step is preferably preceded by the step of electrically isolating first and second portions of the second lower bit line from each other, and electrically connecting the first lower bit line to the second portion of the second lower bit line to increase the effective capacitance of the first lower bit line. The amplifying step is also followed by the step of restoring the states of the first and second reference memory cells. The preferred method also preferably comprises the steps of writing the state of the data memory cell by applying data to the first upper bit line and then applying a plate line voltage to the second upper bit line after commencement of the step of applying data to the first upper bit line. Moreover, because the first and second reference memory cells preferably comprise first and second ferroelectric reference capacitors which are electrically connected to the first portion of the second lower bit line, the restoring step preferably comprises disposing the first ferroelectric reference capacitor in a first polarization state and then disposing the second ferroelectric capacitor in a second polarization state, opposite the first polarization state, by applying a plate line voltage to the first portion of the second lower bit line.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 5:
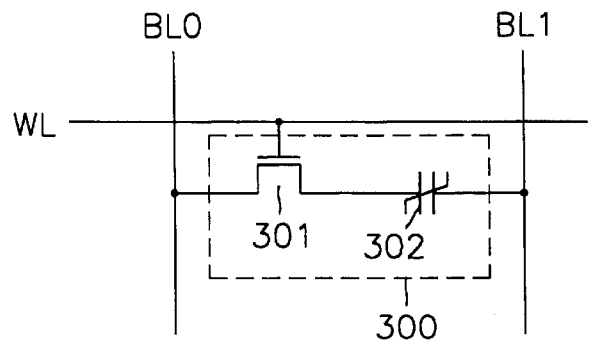
FIG. 5 is an electrical schematic of a unit cell of a ferroelectric memory device according to an embodiment of the present invention.

Referring to FIG. 5, a memory cell 300 includes one access transistor 301 and one ferroelectric capacitor 302. A first drain/source of the access transistor 301 is connected to a bit line BL0, a gate is connected to a word line WL and a second drain/source is connected to one end of the ferroelectric capacitor 302. The other end of the ferroelectric capacitor 302 is connected to a bit line BL1. In this structure, a data signal can be input to or output from a predetermined one of the bitlines BL0 and BL1. For example, when the data signal is input to or output from the bit line BL0, the bit line BL1 acts as a plate line. Here, the bit line BL1 which accesses other memory cells (not shown) is usable as a data line.

In FIG. 5, the access transistor consists of an NMOS transistor. The ferroelectric capacitor 302 is programmed to a first or second polarization state according to the voltage applied across the ends thereof. In the event the voltage applied across the ends of the ferroelectric capacitor 302 is 0 Volts, the original programmed polarization state is maintained.

In order to perform a reading operation on the memory cell 300, the bit line is precharged to 0 Volts. Then, a "high" level signal is applied to the word line WL, to thereby electrically connect the bit line BL0 to the ferroelectric capacitor 302. The plate voltage, for example, 5 Volts, is applied to the bit line BL1 which acts as a plate line. A voltage represented in the data line changed by a polarization state of the ferroelectric capacitor 302 is sensed as data. For example, if the bit line BL0 is determined as a data line and the bit line BL1 is determined as a plate line, the plate voltage is applied to the bit line BL1 to thereby sense the voltage represented in the bit line BL0 and read data.

In order to perform a writing operation on the memory cell 300, a "high" level signal is applied to the word line WL to turn-on an access transistor 301. The data signal is applied to a predetermined one of the bit lines, and the plate voltage is applied to the other bit line. Accordingly, the ferroelectric capacitor 302 is programmed by a voltage difference between the data signal and the plate voltage which are applied across the ends of the capacitor 302. Here, the magnitude of the voltage required for programming the ferroelectric capacitor 302 can be changed by changing the composition ratio of ferroelectric materials constituting the ferroelectric capacitor. For example, a program voltage can be changed by changing the composition ratio of PZT and silicon oxide.

Figure 6:
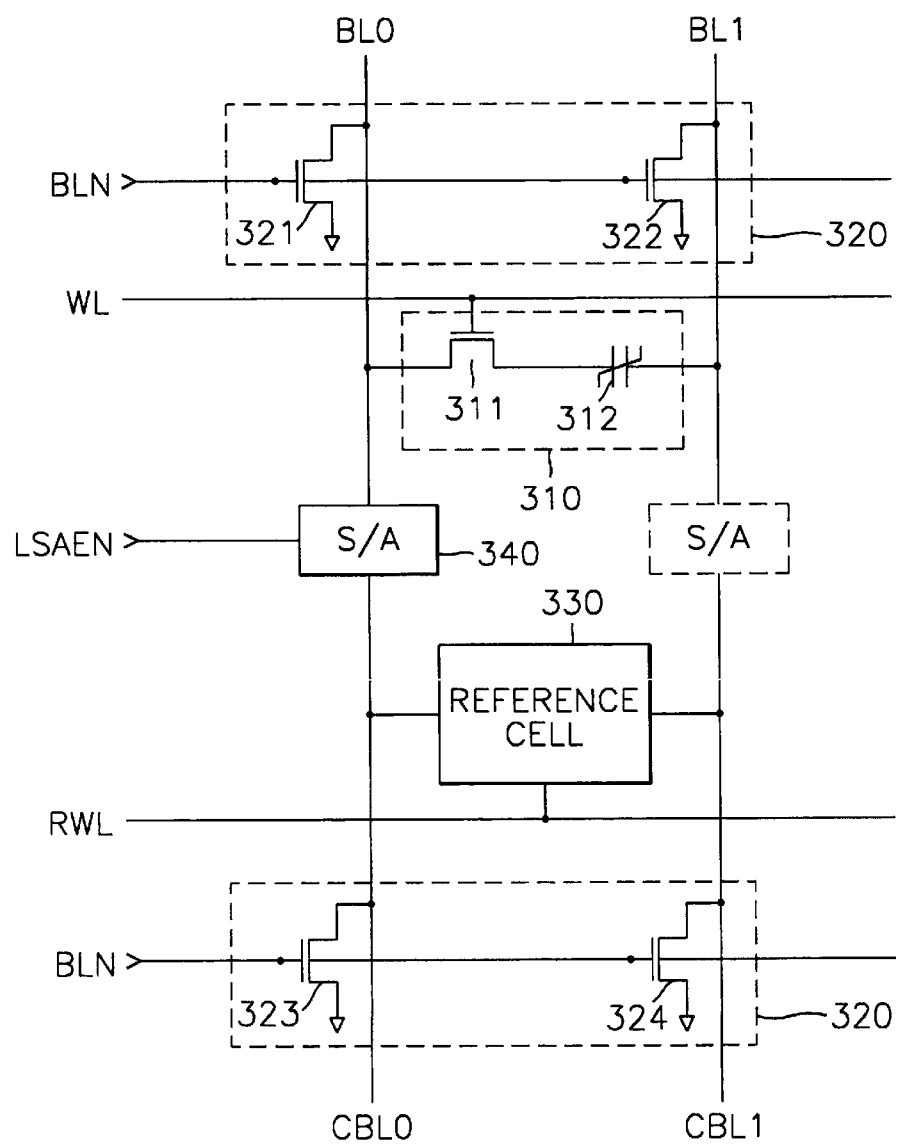
FIG. 6 is an electrical schematic of a ferroelectric memory device according to an embodiment of the present invention.
Figure 7:
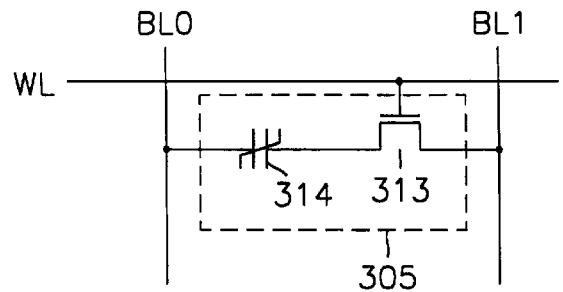
FIG. 7 is an electrical schematic of a unit cell of a ferroelectric memory device according to an embodiment of the present invention.

FIG. 6 is a circuit diagram showing a nonvolatile ferroelectric memory device according to another embodiment of the present invention. Referring to FIG. 6, an operation memory cell 310 consists of one access transistor 311 and one ferroelectric capacitor 312. A first drain/source of the access transistor 311 is connected to the bit line BL0, a second drain/source is connected to one end of the ferroelectric capacitor 312 and a gate is connected to a word line WL. The other end of the ferroelectric capacitor 312 is connected to the bit line BL1. FIG. 7 shows another structure of an operation memory cell. Referring to FIG. 7, the operation memory cell 315 can consist of one access transistor 313 and one ferroelectric capacitor 314. A drain/source path of the access transistor 313 is formed between the ferroelectric capacitor 314 and the bit line BL1, and a gate is connected to the word line WL. In the operation memory cell shown in FIGS. 6 and 7, data is stored in the state of polarization of the ferroelectric capacitor.

Referring again to FIG. 6, a bit line precharging circuit 320 includes NMOS transistors 321, 322, 323 and 324. The drain of the NMOS transistor 321 is connected to the bit line BL0, its source is grounded and a bit line precharge enable signal BLN is applied to its gate. The drain of the NMOS transistor 322 is connected to the bit line BL1, its source is grounded and the bit line precharge enable signal BLN is applied to its gate. The drain of the NMOS transistor 323 is connected to the bit line CBL0, its source is grounded and a bit line precharge enable signal BLN is applied to its gate. The drain of the NMOS transistor 324 is connected to the bit line CBL1, its source is grounded and the bit line precharge enable signal BLN is applied to its gate. Accordingly, when the bit line precharge enable signal BLN becomes a "high" level, the NMOS transistors 321, 322, 323 and 324 are turned on to precharge the bit lines BL0, BL1, CBL0 and CBL1 to a ground voltage level (e.g., logic "0").

A reference cell 330 is connected between the bit line CBL0 and the bit line CBL1, and accessed by a reference word line RWL. That is, when the reference word line RWL becomes active and the plate voltage is applied to the bit line CBL1, an intermediate value between the voltages of data "1" and "0" is represented in the bit line CBL0. The preferred construction and operation of a reference cell is described more fully hereinbelow. A sense amplifier 340 is connected between the bitlines BL0 and CBL0, and amplifies a voltage difference between the bit lines BL0 and CBL0 when a sense amplifier enable signal LSAEN is active.

In FIG. 6, the bit line BL0 acts as a data line, the bit line CBL0 acts as an inversion data line, and the bit lines BL1 and CBL1 act as plate lines. However, the operations of the bit lines BL0, BL1, CBL0 and CBL1 can be exchanged with each other. In particular, as described more fully hereinbelow with respect to FIG. 12, the bit lines BL1 and CBL1 can act as data lines and inversion data lines during a data reading/writing operation on another operation memory cell (not shown).

Figure 8:
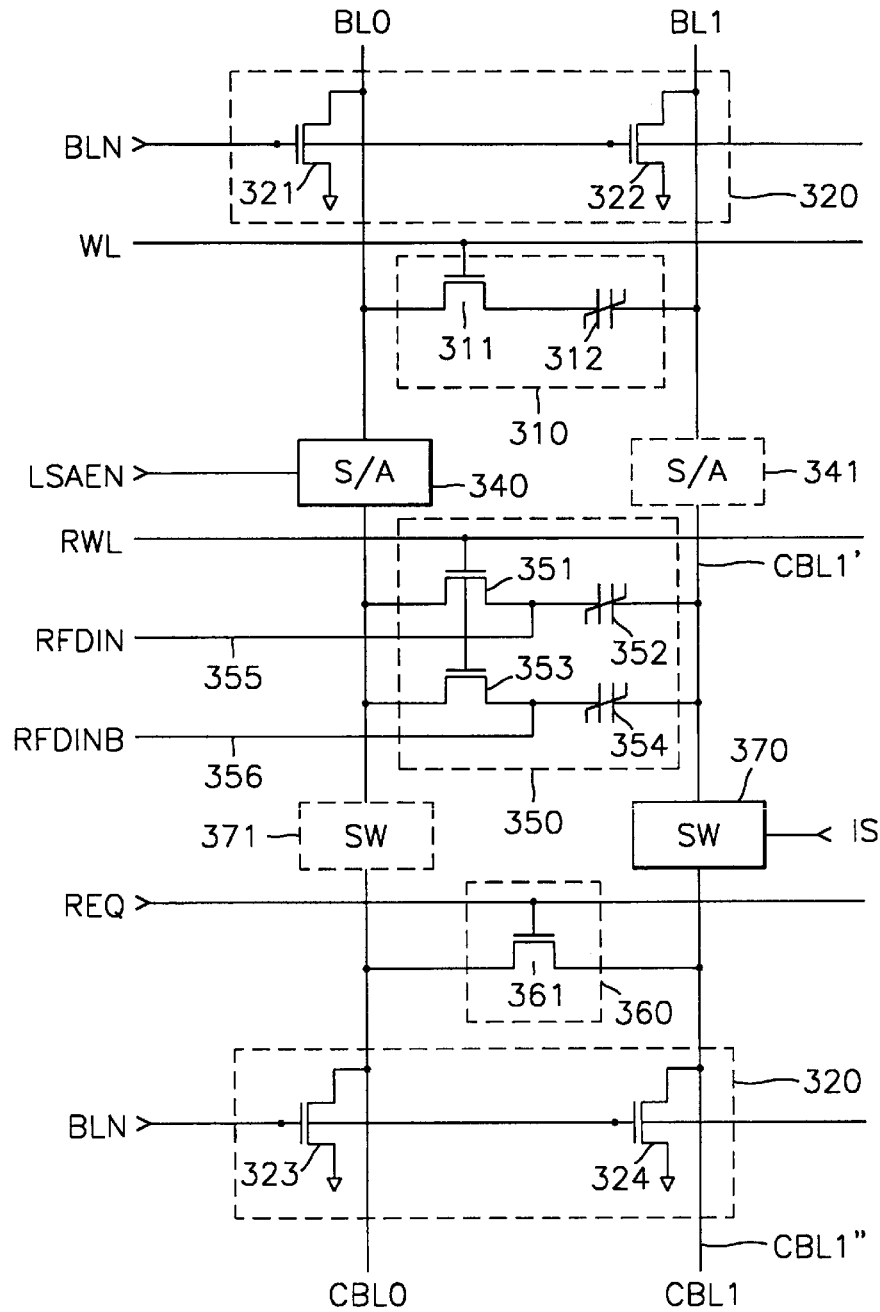
FIG. 8 is an electrical schematic of a ferroelectric memory device according to an embodiment of the present invention.

FIG. 8 is a circuit diagram showing a nonvolatile ferroelectric memory device according to another embodiment of the present invention. Referring to FIG. 8, an operation memory cell 310 includes one access transistor 311 and one ferroelectric capacitor 312. The access transistor 311 consists of an NMOS transistor having a first drain/source connected to a bit line BL0, a second drain/source connected to the ferroelectric capacitor 312 and a gate connected to a word line WL. The ferroelectric capacitor 312 is connected between the second drain/source of the access transistor 311 and the bit line BL1. The operation memory cell can also be formed as shown in FIG. 7.

A reference cell 350 consists of two reference cell access transistors 351 and 353 and two reference cell ferroelectric capacitors 352 and 354. A first drain/source of the reference cell access transistor 351 is connected to the bit line CBL0 and its gate is connected to a reference word line RWL. One end of the reference cell ferroelectric capacitor 352 is connected to a second drain/source of the reference cell access transistor 351 and a reference cell data write line 355, and the other end thereof is connected to a bit line CBL1'. Likewise, a first drain/source of the reference cell access transistor 353 is connected to the bit line CBL0 and its gate is connected to the reference word line RWL. One end of the reference cell ferroelectric capacitor 354 is electrically connected to a second drain/source of the reference cell access transistor 353 and a reference cell inversion data write line 356, and the other end thereof is connected to the bit line CBL1'.

A sense amplifier 340 is connected between the bit lines BL0 and CBL0, and when a sense amplifier enable signal LSAEN is active, amplifies a voltage difference between the bit lines BL0 and CBL0. The sense amplifier 341 connected between the bit lines BL1 and CBL1 is for accessing an another operation memory cell (see, e.g., FIG. 12). A bit line precharging portion 320 consists of four NMOS transistors 321, 322, 323 and 324. Each drain of the NMOS transistors is connected to the bit line corresponding thereto, each source thereof is grounded and bit line precharge enable signal BLN is applied to each gate thereof. Accordingly, when the bit line precharge enable signal BLN is activated to a "high" level, a voltage of the bit line corresponding thereto is precharged to a ground voltage level.

A bit line equalizer circuit 360 can consist of one NMOS transistor 361. A first drain/source of the NMOS transistor 361 is connected to the bit line CBL0, a second drain/source thereof is connected to the bit line CBL1, and a bit line equalizer enable signal REQ is applied to its gate. Accordingly, in the case that the bit line equalizer enable signal REQ is a "high" level, the NMOS transistor 361 is turned on to electrically connect the bit lines CBL0 and CBL1.

An isolation switch 370 connected onto the bit line CBL1, is turned off in the case that an isolation switch control signal IS is inactive. When the isolation switch 370 is turned off, the bit line CBL1 is electrically divided to a portion CBL1' connected to a reference cell 350 and a portion CBL1" not connected thereto. As described more fully hereinbelow, the portion CBL1" can be electrically connected to bit line CBL0 when reading the program state of the operation memory cell 310. The isolation switch 371 is used for accessing an another operation memory cell (not shown). A plurality of isolation switches can be selectively turned on or off according to address information applied externally.

The reading operation of the nonvolatile ferroelectric memory device shown in FIG. 8 will now be described with reference to the timing diagram of FIG. 9. According to a result that addresses applied externally are decoded, a plurality of bit lines are determined as data lines (and inversion data lines) and plate lines and then the isolation switches 370 or 371 are turned off. In FIG. 8, the memory cell 310 is accessed by determining the bit line BL0 as a data line, the bit line CBL0 as an inversion data line and the bit lines BL1 and CBL1 as plate lines. The bit line CBL1 is electrically divided into a portion CBL1' connected to the reference cell 350 and a portion CBL1" which is electrically connected to the isolation switch 370 and the precharging circuit 320. As described herein, the bit lines BL1, CBL1' and CBL1" can be identified as individual segments of a respective bit line.

When the bit line precharge enable signal BLN becomes a "high" level, the bit lines BL0, BL1, CBL0 and CBL1 are precharged to 0 Volts. When the bit line precharge enable signal BLN then becomes a "low" level, the bit lines are placed in respective floating states. At this time, a "high" level is applied to the word line WL and the reference word line RWL to turn on the access transistor 311 and the reference cell access transistors 351 and 353. Accordingly, the ferroelectric capacitor 312 is electrically connected to the bit line BL0, and the reference cell ferroelectric capacitors 352 and 354 are electrically connected to the bit line CBL0. In the state that the access transistor and the reference cell access transistors are turned on, when the bit line equalizer enable signal REQ is active to a "high" level, the bit lines CBL0 and CBL1" are electrically connected together (i.e., "shorted"). Accordingly, the bit lines CBL0 and CBL1" act as the inversion data lines, and the bit line CBL1' acts as the plate line. Here, when the length of the bit line CBL1' is substantially shorter than that of the bit line CBL1", the effective capacitance of the inversion data line increases by about a factor of two. Also, assuming that the capacitance of the bit line BL0 equals that of the bit line CBL0, the capacitance of the bit line BL0 and the net capacitance of the inversion data lines CBL0 and CBL1 " can be represented as $C_{BL}$ and $2C_{BL}$, respectively.

Figure 1:
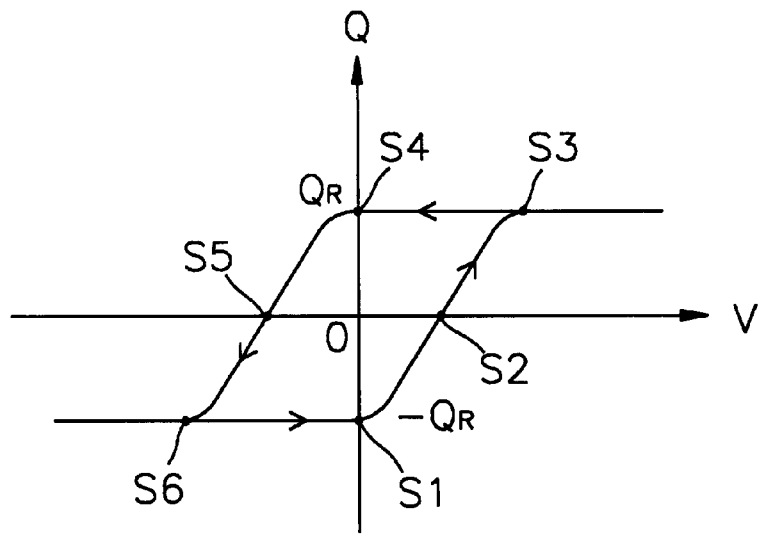
FIG. 1 is a graphical illustration of a hysteresis characteristic of a ferroelectric capacitor.
Figure 2:
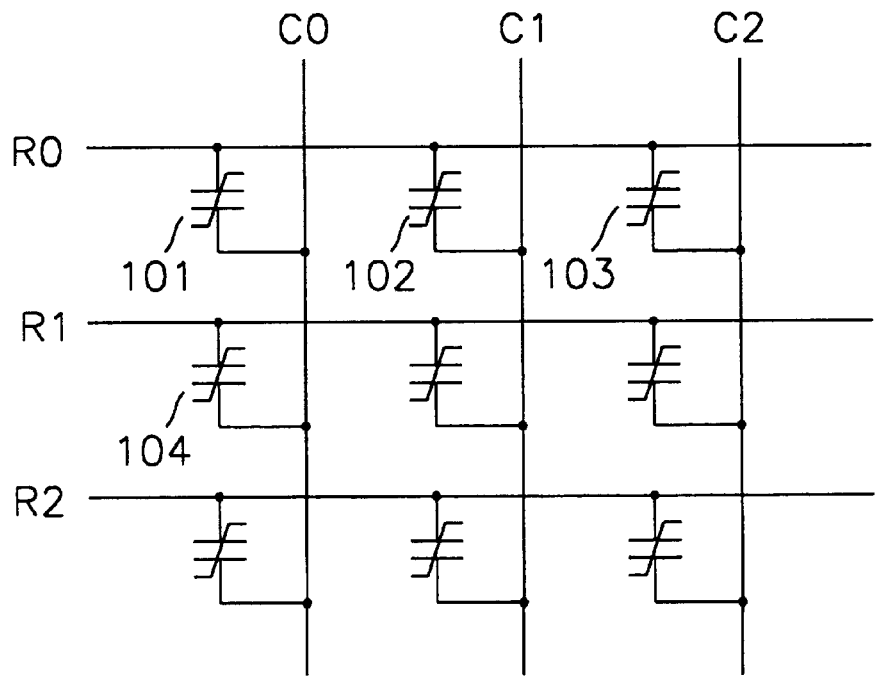
FIG. 2 is an electrical schematic of a first conventional ferroelectric memory device.
Figure 3:
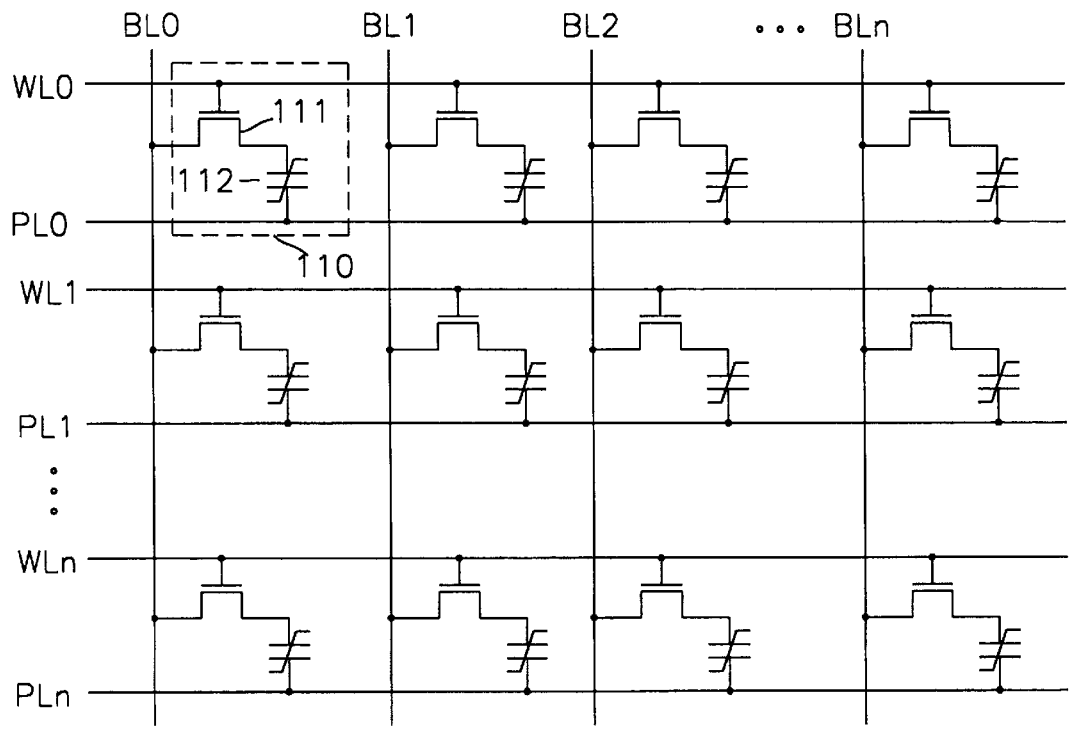
FIG. 3 is an electrical schematic of a second conventional ferroelectric memory device.
Figure 4:
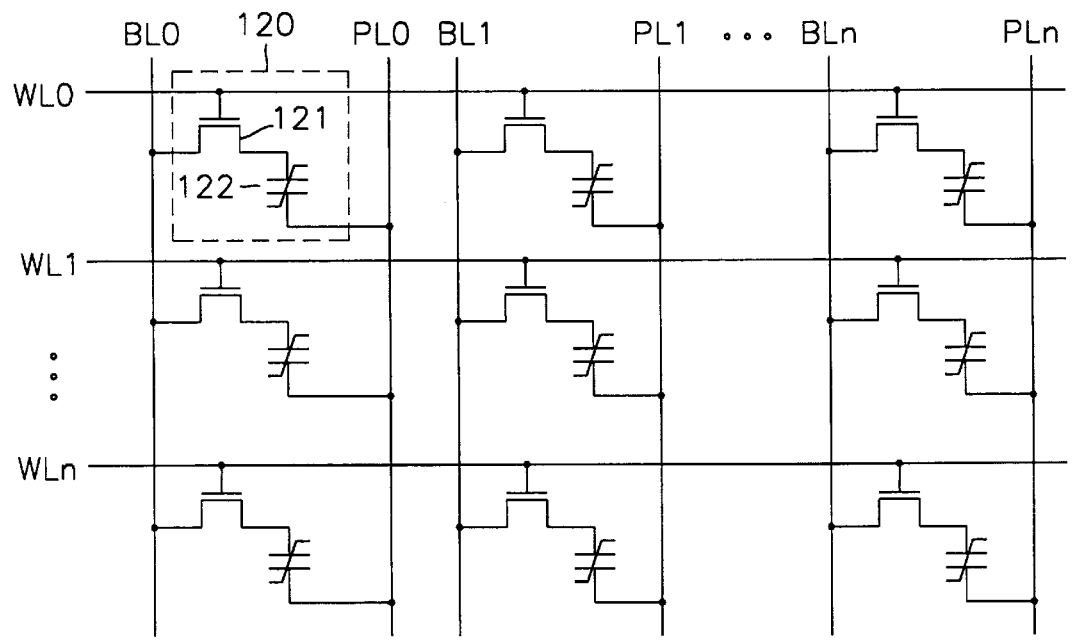
FIG. 4 is an electrical schematic of a third conventional ferroelectric memory device.
Figure 9:
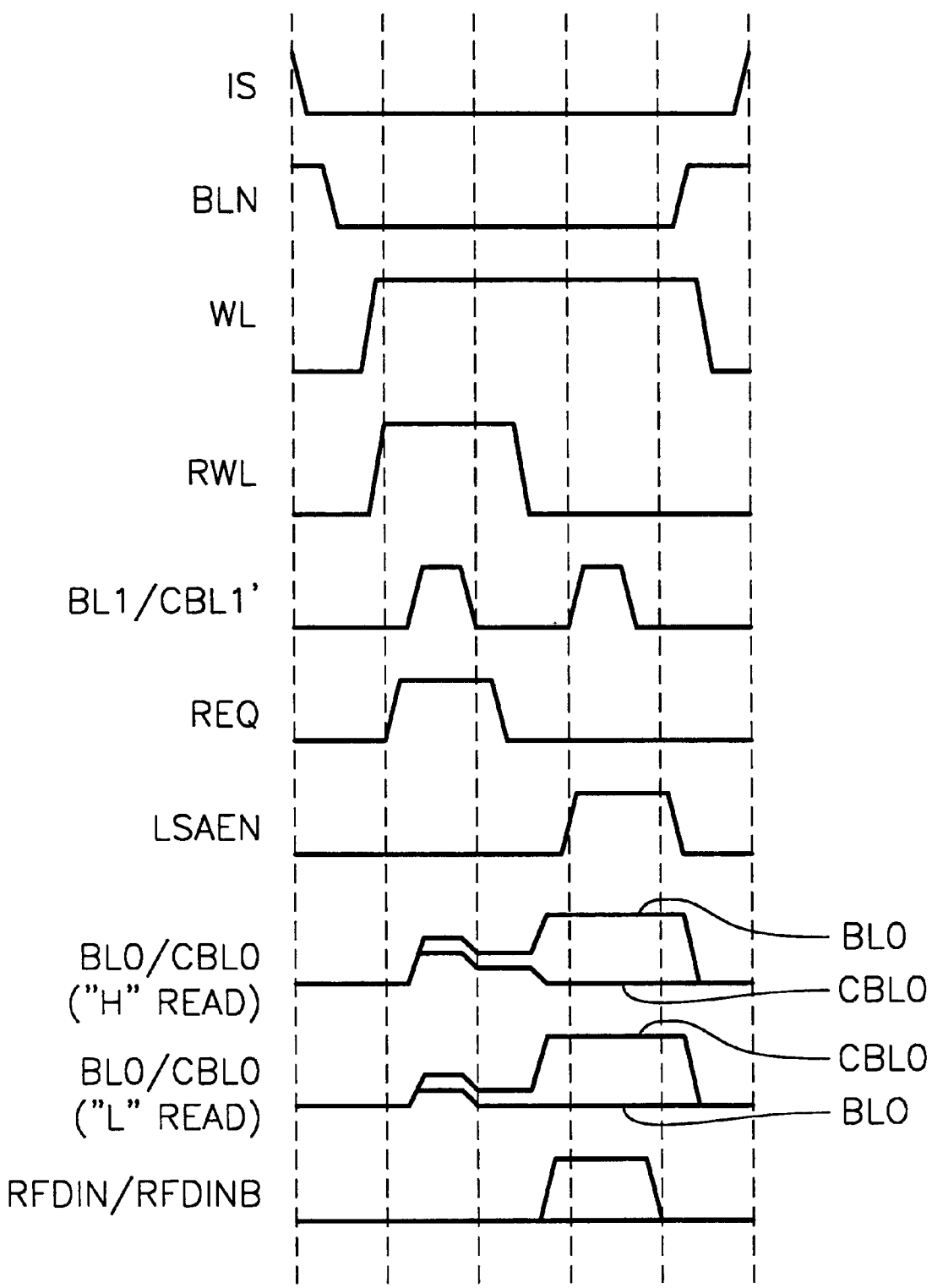
FIG. 9 is a timing diagram which illustrates a method of performing a reading operation on the memory device of FIG. 8.

As illustrated by FIG. 9, a plate voltage, for example, 5 Volts, is then applied to the bit lines BL1 and CBL1' determined as the plate line. When the plate voltage is applied, a voltage level according to a polarization state of the ferroelectric capacitor 312 in the operation memory cell 310 is transferred to the bit line BL0. In more detail, when data "1", i.e., a state of S4 in FIG. 1, is stored in the ferroelectric capacitor 312, the ferroelectric capacitor 312 is transitioned to the state of S6 in FIG. 1, and a voltage level of the data/bit line BL0 is expressed by formula 3:

$$V_{data\ line} \frac{2Q_R}{C_{BL}}$$

where data "1" is stored and $C_{BL}$ represents the capacitance of the bit line BL0. Meanwhile, when data "0", i.e., the state of S1 in FIG. 1, is stored in the ferroelectric capacitor 312, the ferroelectric capacitor 312 is transitioned to the state of S6 in FIG. 1. However, since the amounts of electric charge stored in the ferroelectric capacitor 312 in each state of S1 and S6 are almost the same, a voltage level of the bit line BL0 can be maintained at the ground level.

Data opposite to each other are preferably stored in the reference cell ferroelectric capacitors 352 and 354. For example, data "1" is stored in the reference cell ferroelectric capacitor 352 and data "0" is stored in the reference cell ferroelectric capacitor 354. To reduce fatigue caused by the performance of destructive reference cell read operations, the data stored in the reference cell ferroelectric capacitors 352 and 354 can be alternated so that each cell bears only half the fatigue burden. According to another aspect of the invention, linear reference cell capacitors may also be used instead of ferroelectric reference cell capacitors to lessen the likelihood of fatigue parasitics. Also, each capacitance of the ferroelectric capacitors 352 and 354 can be the same as that of the access transistor 311 or 313 of the operation memory cell. Here, capacitance of the data line is $C_{BL}$ and the effective bit line capacitance of the inversion data line is $2C_{BL}$, so that an intermediate level of the voltage level of the data "0" and the data "1" appears on the inversion data line. In more detail, while the reference cell ferroelectric capacitor 352 in the state of S4 of FIG. 1 is transitioned to the state of S6 thereof, the amount of electric charge of $2Q_R$ is transferred to the inversion data lines CBL0 and CBL1", and while the reference cell ferroelectric capacitor 354 in the state of S1 of FIG. 1 is transitioned to the state of S6 thereof, the amount of electric charge close to "0" is transferred to the inversion data lines CBL0 and CBL1". Accordingly, the voltage level of the inversion data line can be expressed by formula 4:

$$V_{inversion\ data\ line} \frac{2Q_R}{2C_{BL}}$$

where $2Q_R$ is the total amount of the electric charge transferred to the inversion data line and $2C_{BL}$ is the effective capacitance of the inversion data lines CBL0 and CBL1". Subsequently, voltages applied to the bit lines BL1 and CBL1' are decreased to a ground level. At this time, the ferroelectric capacitor 312 and the reference cell ferroelectric capacitors 352 and 354 transition to the state of S1 of FIG. 1. Then, the bit line equalizer enable signal REQ is inactivated by a "low" level to electrically disconnect the bit lines CBL0 and CBL1" from each other. Also, the reference word line RWL is inactivated by a "low" level to electrically disconnect the reference cell ferroelectric capacitors 352 and 354 and the bit line CBL0 from each other.

Subsequently, a sense amplifier enable signal LSAEN is activated by a "high" level. The sense amplifier 340 amplifies a difference in voltage between the bit line BL0 acting as the data line and the bit line CBL0 acting as the inversion data line. Accordingly, when data "1" is stored in the operation memory cell 310, the bit line BL0 becomes a logic "high" level, and when data "0" is stored in the operation memory cell 310, the bit line BL0 becomes a logic "low" level. At this time, the bit line BL1 is fixed at a ground level, so that the ferroelectric capacitor 312 storing the data "1" becomes set to the state of S3 of FIG. 1 (i.e., restored), and the ferroelectric capacitor 312 storing the data "0" is maintained in the state S1 of FIG. 1. Each voltage level of the bit lines BL0 and CBL0 amplified by the sense amplifier is output as a data signal and an inversion data signal, respectively.

Meanwhile, the bit line CBL0 and the reference cell ferroelectric capacitors 352 and 354 are electrically disconnected due to the reference word line RWL being set to a "low" level. A "high" level is also applied to the reference cell data line RFDIN, and a "low" level is applied to the inversion reference cell data line RFDINB to initiate reestablishment of the reference cell ferroelectric capacitors 352 and 354 with their originally stored data "1" and data "0" levels. As described above, the data restored in the reference cell ferroelectric capacitors may be alternated after ever read operation (or multiple read operations). Accordingly, if "high" and "low" levels are applied to the reference cell data line RFDIN and the inversion reference cell data line RFDINB during a restore operation, respectively, then during a subsequent restore operation, "low" and "high" levels may be applied to the reference cell data line RFDIN and the inversion reference cell data line RFDINB.

A plate voltage is then applied to a bit line CBL1' determined as a plate line. The plate voltage is designed to have a full power source level (full VCC). That is, if VCC is 5 Volts, the plate voltage is 5 Volts, and if VCC is 3 Volts, the plate voltage is 3 Volts. Accordingly, the reference cell ferroelectric capacitor 352 transitions to the state of S3 of FIG. 1 when RFDIN transitions to a "high" level while CBL1' is held at a "low" level, and then the reference cell ferroelectric capacitor 354 transitions to the state of S6 when CBL1' is switched to a "high" level while RFDINB is held at a "low" level. Subsequently, when the bit line CBL1' becomes reset to ground level and the reference cell data line RFDIN and the reference cell inversion data line RFDINB are grounded, the reference cell ferroelectric capacitor 352 transitions to the state of S4 of FIG. 1 and the reference cell ferroelectric capacitor 354 transitions to the state of S1 of FIG. 1. That is, data "1" and "0" levels are restored to the reference cell ferroelectric capacitors 352 and 354. Also, the bit line precharge enable signal BLN then becomes set to a "high" level, and the wordline WL connected to the operation memory cell becomes inactivated by a "low" level.

Figure 10:
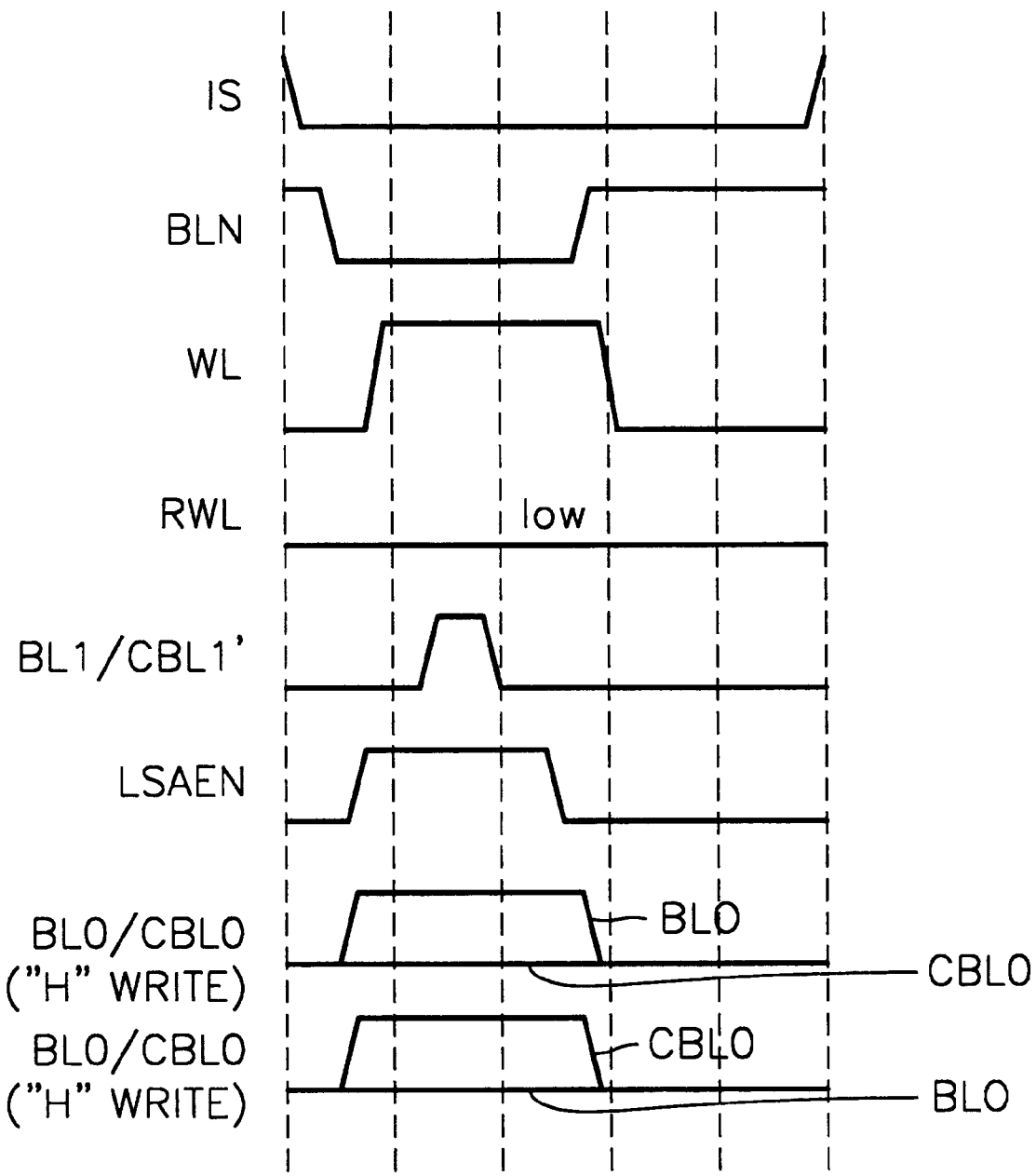
FIG. 10 is a timing diagram which illustrates a method of performing a writing operation on the memory device of FIG. 8.

A writing operation for the nonvolatile ferroelectric memory device shown in FIG. 8 will now be described with reference to FIG. 10. First, an address is applied and decoded and a plurality of bit lines are determined as data lines (and inversion data lines) and plate lines and isolation switches 370 is turned off. The method for determining the bit lines in order to access an operation memory cell 310 of FIG. 8 is the same as that illustrated in FIG. 9.

When a bit line precharge enable signal BLN is activated by a "high" level, the bit lines BL0, BL1, CBL0 and CBL1 are precharged to a ground level. In this state, the bit line precharge enable signal BLN is inactivated by a "low" level, to thereby float the bit lines BL0, BL1, CBL0 and CBL1. Subsequently, the data signal to be written is applied to the bit line BL0 determined as the data line, and the inversion data signal is applied to the bit line CBL0 determined as the inversion data line. At this time, a sense amplifier enable signal LSAEN is activated by a "high" level. When the word line WL is activated by a "high" level in order to access the operation memory cell 310, a ferroelectric capacitor 312 is electrically connected to the bit line BL0. However, a reference word line RWL is maintained in an inactive state by applying a "low" level thereto. At this time, when a data signal of a "high" level is applied to the bit line BL0, a ferroelectric capacitor 312 transitions to the state of S3 of FIG. 1 while the bit/plate line BL1 is maintained at a "low" level.

In a state that the word line WL is active and the data signal and the inversion data signal are applied, a plate voltage is applied to the bit lines BL1 and CBL1' determined as the plate lines. Here, in the case that a "high" level signal is applied to the bit line BL0 determined as a data line, the ferroelectric capacitor 312 in the state of S3 of FIG. 1 transitions to state S4. However, in the event a "low" level signal is applied to the bit line BL0, the ferroelectric capacitor 312 transitions to state S6. Then, the bit lines BL1 and CBL1' (determined as the plate lines) are reset to a ground level and the word line WL is inactivated by a "low" level. Accordingly, in the event a "high" level signal is applied to the bit line BL0, the ferroelectric capacitor 312 transitions to state S3 and then to state S4. However, in the event a "low" level signal is applied to the bit line BL0, the ferroelectric capacitor 312 transitions to state S6 when BL1 is "high" and then transitions to state S1 when BL1 becomes "low".

Figure 11:
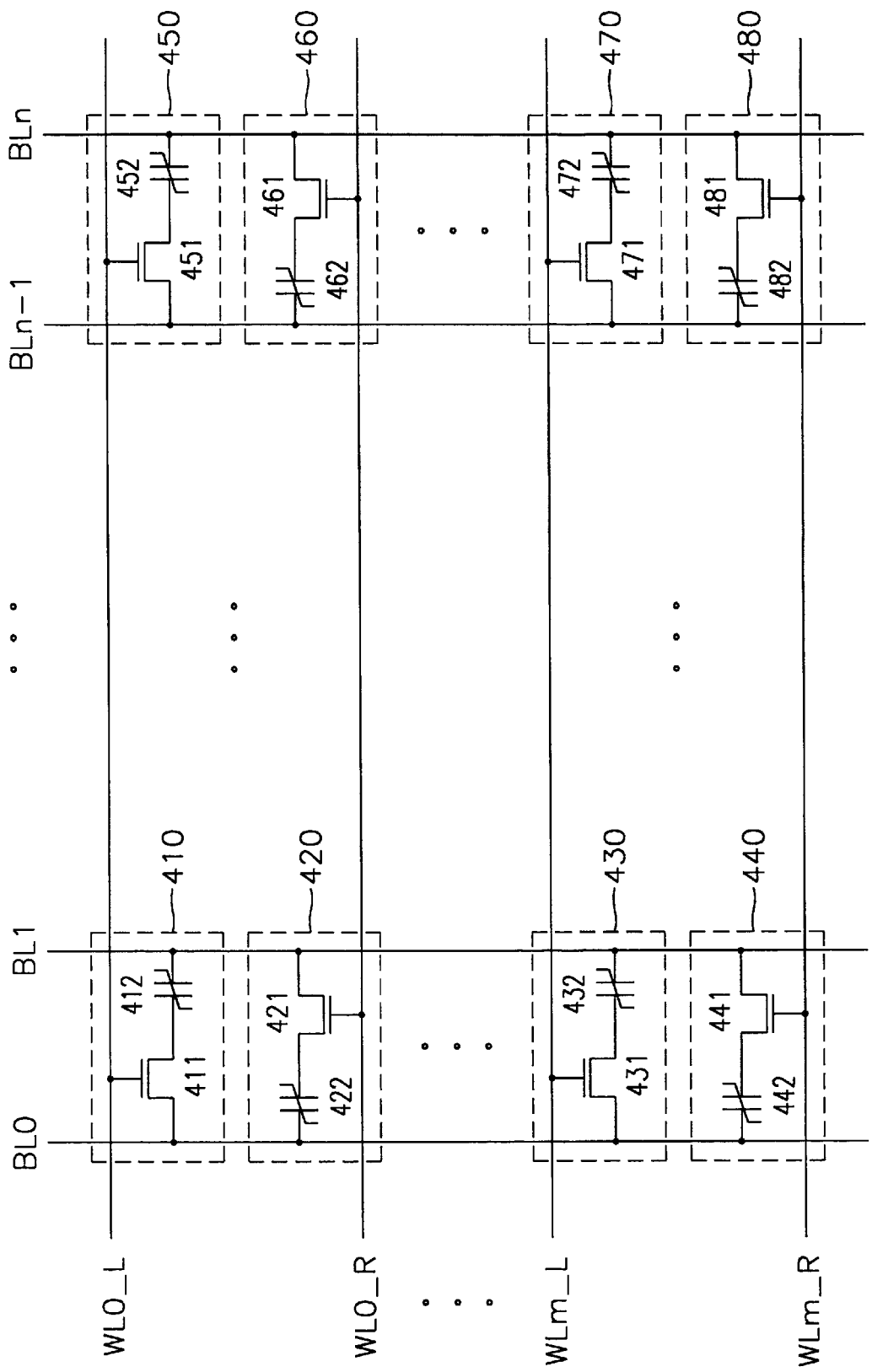
FIG. 11 is an electrical schematic of a ferroelectric memory cell array according to an embodiment of the present invention.

FIG. 11 shows an operation memory cell array. In FIG. 11, each operation memory cell consists of one access transistor and one ferroelectric capacitor. A plurality of operation memory cells are arranged as an array in a matrix format corresponding to a plurality of the bit lines BL0, BL1, ... , BLn−1 and BLn and a plurality of word lines WL0_L, WL0_R, ..., WLm_L and WLm_R. In the operation memory cell, each ferroelectric capacitor is connected to neighboring bit lines through a drain/source path of an access transistor. In the access transistor 411 of the operation memory cell 410 of FIG. 11, a first drain/source is connected to the bit line BL0, and the ferroelectric capacitor 412 is connected between a second drain/source of the access transistor 411 and the bit line BL1. The gate of the access transistor 411 is connected to the word line WL0_L. Meanwhile, in the operation memory cell 420, a first drain/source of the access transistor 421 is connected to the bit line BL1, and the ferroelectric capacitor 422 is connected between a second drain/source of the access transistor 421 and the bit line BL0. The gate of the access transistor 421 is connected to the word line WL0_R. That is, the structures of the operation memory cells 410 and 420 are symmetrical. In this state, in order to access the operation memory cell 410, the word line WL0_L is activated by a "high" level, and the bit line BL0 is used as a data line and the bit line BL1 is used as a plate line. Meanwhile, in order to access the operation memory cell 420, the word line WL0_R is activated by a "high" level, and the bit line BL1 is used as a data line and the bit line BL0 is used as a plate line. Here, the other bit lines can be maintained at a ground level.

Accordingly, the access transistors of the operation memory cells connected to the same word line are turned on. At this time, the plate voltage is applied to only the ferroelectric capacitor of the accessed operation memory cell, while the plate voltage is not applied. In more detail, in the case of accessing the operation memory cell, the word line WL0_L is activated by a "high" level and the other word lines are maintained at a "low" level. Accordingly, the access transistors 421, 431 and 441 are maintained in a turned-off state so that one end of each of the ferroelectric capacitors 422, 432 and 442 is held in a floating state.

Meanwhile, a data signal is input to and output from the bit line BL0 and the plate voltage is applied to the bit line BL1, however, the other bit lines are typically maintained at a ground level. Accordingly, 0 Volts is applied to the ferroelectric capacitors included in the operation memory cells 450, 460, 470 and 480, so that the ferroelectric capacitors which are not accessed are not exposed to an operation cycle. Alternatively, BL1, BL3, BL5 ..., BLn can receive the plate line voltages simultaneously so that all cells connected to word line WL0_L can be read at the same time.

Figure 12:
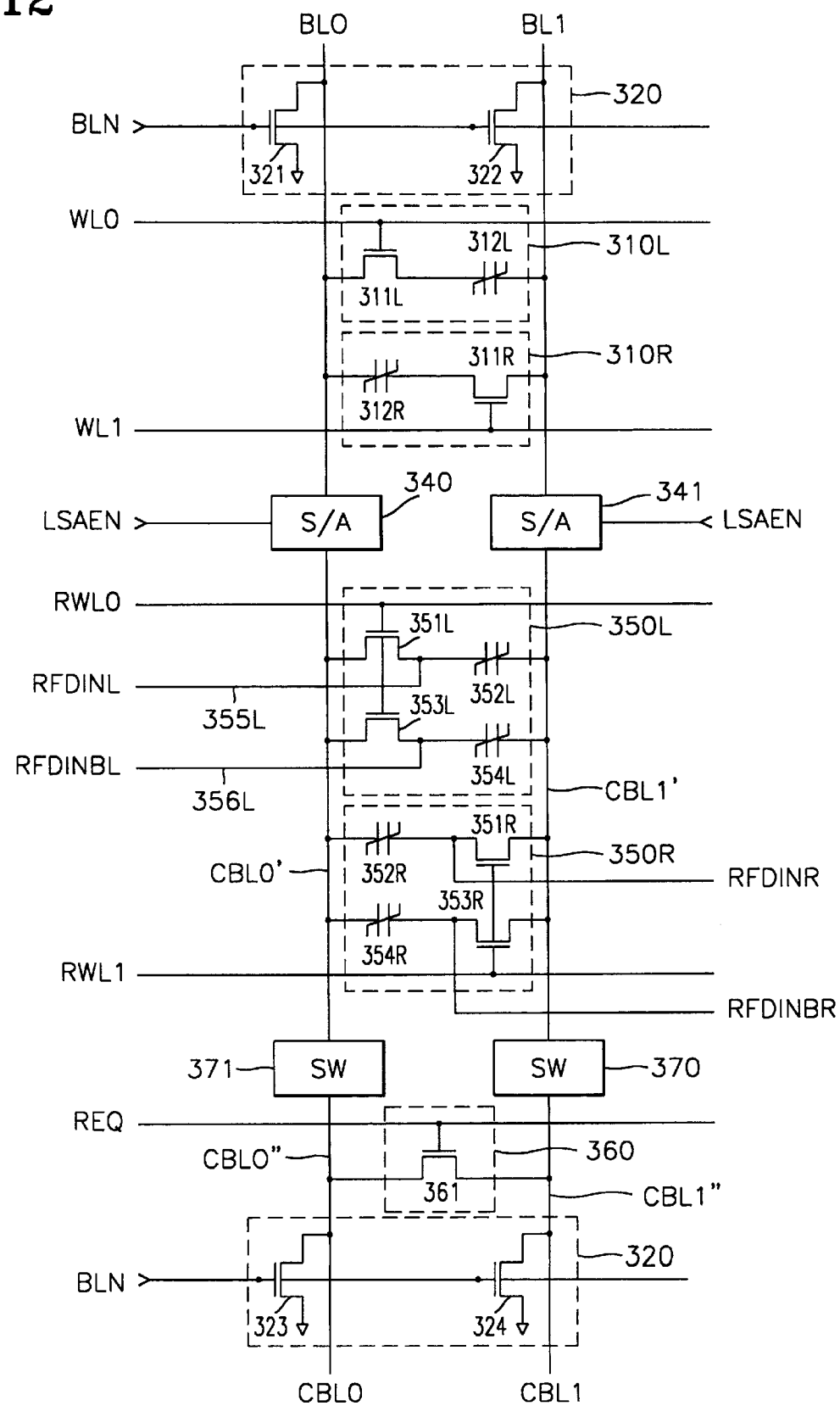
FIG. 12 is an electrical schematic of a ferroelectric memory device according to an embodiment of the present invention.

FIG. 12 shows a nonvolatile ferroelectric memory device according to yet another embodiment of the present invention. In FIG. 12, an operation memory cell 310L includes an access transistor 311L and a ferroelectric capacitor 312L, and an operation memory cell 310R includes an access transistor 311R and a ferroelectric capacitor 312R. As illustrated, memory cells 310L and 310R are electrically connected in antiparallel. A reference cell 350L includes two reference cell access transistors 351L and 353L and two reference cell ferroelectric capacitors 352L and 354L, and a reference cell 350R includes two reference cell access transistors 351R and 353R and two reference cell ferroelectric capacitors 352R and 354R. The operations for reading and writing data in ferroelectric capacitor 312L are similar to the operations described with reference to FIGS. 9 and 10. In particular, in order to access the operation memory cell 310L, a word line WL0 is activated by a "high" level, a bit line BL0 is determined as a data line, a bit line CBL0 is determined as an inversion data line and the bit lines BL1 and CBL1 are used as plate lines.

Bit lines BL0 and CBL0 can also be treated as discrete segments of an individual even bit line and bit lines BL1 and CBL1 can similarly be treated as segments of an odd bit line.

In the event a reading operation is performed on the operation memory cell 310L, the reference word line RWL0 is activated by a "high" level to thereby access the reference cell 350L, the isolation switch 370 is turned off so that CBL1' and CBL1" are disconnected and the isolation switch 371 is turned on so that CBL0' and CBL0" are connected to each other. Also, the bit line equalizer enable signal REQ is activated by a "high" level to turn-on an NMOS transistor 361. Accordingly, during the reading operation for the operation memory cell 310L, a portion CBL1' connected to the reference cell CBL1 of the bit line acts as a plate line, and CBL1 together with the bit line CBL0 acts as an inversion data line. The data signal and the inversion data signal are amplified by a sense amplifier 340. Also, in order to restore the data in the reference cell 350L after a reading operation, the reference word line RWL0 becomes a "low" level to electrically disconnect the bit line CBL0 from the reference cell ferroelectric capacitors 352L and 354L. A "high" level is also applied to the reference cell data line RFDINL and a "low" level is applied to an inversion reference cell data line RFDINBL.

Now, a reading operation for an operation memory cell 310R will be described. In order to access a memory cell 310R of FIG. 12, a bit line BL1 is determined as a data line, a bit line CBL1 is determined as an inversion data line and bit lines BL0 and CBL0 are determined as plate lines. An isolation switch 371 is turned off, and an isolation switch 370 is maintained in a turned on state (see, signal IS in FIG. 8). Accordingly, the bit line CBL0 is electrically divided into a portion CBL0' connected to the reference cell 350R and a portion CBL0" connected to the isolation switch 371.

When a bit line precharge enable signal BLN becomes a "high" level, the bit lines BL0, BL1, CBL0" and CBL1 are precharged to 0 Volts. When the bit line precharge enable signal BLN becomes a "low" level, the bit lines are in the floating states. At this time, a "high" level is applied to the word line WL1 and the reference word line RWL1, to thereby turn on an access transistor 311R and reference cell access transistors 351R and 353R. Accordingly, a ferroelectric capacitor 312R becomes electrically connected to the bit line BL1, and reference cell access transistors 352R and 354R become electrically connected to the bit line CBL1'. At this time, an access transistor 311L and reference cell access transistors 351L and 353L are maintained in a turned-off state. Accordingly, a ferroelectric capacitor 312L and reference cell ferroelectric capacitors 352L and 354L have no influence on the operations for reading the operation memory cell 310R.

In the state that the access transistor 311R and the reference cell access transistors 351R and 353R are turned on, when a bit line equalizer enable signal REQ is activated by a "high" level, the bit lines CBL1 and CBL0" are electrically connected. Accordingly, the bit lines CBL1 and CBL0" act as inversion data lines, and the bit line CBL0' acts as a plate line. Accordingly, the capacitance of the bit line BL1 becomes $C_{BL}$, and the capacitance of the inversion data line consisting of the bit lines CBL1 and CBL0" becomes $2C_{BL}$. A plate voltage, for example, 5 Volts, is applied to the bit lines BL0 and CBL0' determined as the plate lines. When the plate voltage is applied, a voltage level according to a polarization state of the ferroelectric capacitor 312R appears on the bit line BL1.

Data contrary to each other is stored in the reference cell ferroelectric capacitors 352R and 354R. Also, the capacitance of the ferroelectric capacitors 352R and 354R can be the same as that of the ferroelectric capacitor 312R of the operation memory cell 310R. Here, the capacitance of the data line is $C_{BL}$ and the bit line capacitance of the inversion data line is $2C_{BL}$, so that an intermediate level of voltage (between the voltage levels of data "1" and "0") appears on the inversion data line CBL1.

Subsequently, a plate voltage applied to the bit lines BL0 and CBL0' descends to a ground level. Then, a bit line equalizer enable signal REQ is inactivated by a "low" level, to electrically disconnect the bit lines CBL1 and CBL0". Also, the reference word line RWL1 is inactivated by a "low" level, to electrically disconnect the reference cell ferroelectric capacitors 352R and 354R from the bit line CBL1. Then, a sense amplifier enable signal LSAEN is activated by a "high" level. The sense amplifier 341 amplifies a difference in voltage between the bit line BL1 acting as the data line and the bit line CBL1 acting as the inversion data line. Accordingly, when data "1" is stored in the operation memory cell 310R, the bit line BL1 becomes a logic "high" level, and when data "0" is stored in the operation memory cell 310R. the bit line BL1 becomes a logic "low" level. At this time, the bit line BL0 is set to ground level. Voltage levels of the bit lines BL1 and CBL1 amplified by a sense amplifier are output as a data signal and an inversion data signal, respectively.

In the state that the reference word line RWL1 becomes a "low" level to electrically disconnect the bit line CBL1 from the reference ferroelectric capacitors 352R and 354R. A "high" level is also applied to the reference cell data line RFDINR and a "low" level is applied to the inversion reference cell data line RFDINBR. Shortly thereafter, a plate voltage is applied to the bit line CBL0' determined as a plate line. Subsequently, when the bit line CBL0' becomes the ground level and the reference cell data line RFDINR and the reference cell inversion data line RFDINBR are grounded, data "1" and "0" are restored to the reference cell ferroelectric capacitors 352R and 354R. Also, a bit line precharge enable signal BLN becomes a "high" level and the word line WL1 for the operation memory cell is inactivated by a "low" level.

Meanwhile, a writing operation for the operation memory cell 310R is as follows. The bit line BL1 is determined as a data line, the-bit line CBL1 is determined as an inversion data line and the bit lines BL0 and CBL0 are determined as plate lines. Also, an isolation switch 371 is turned off, and an isolation switch 370 is maintained in a turned-on state. When a bit line precharge enable signal BLN is activated by a "high" level, the bit lines BL0, BL1, CBL0 and CBL1 are precharged to a ground level. In this state, the bit line precharge enable signal BLN is inactivated by a "low" level to thereby float the bit lines BL0, BL1, CBL0 and CBL1.

Subsequently, a data signal to be written is applied to the bit line BL1 determined as the data line, and an inversion data signal is applied to the bit line CBL1 determined as the inversion data line. At this time, a sense amplifier enable signal LSAEN is activated by a "high" level to enable a sense amplifier 341 to operate. In order to access the operation memory cell 310R, the word line WL1 is activated by a "high" level to electrically connect the ferroelectric capacitor 312R to the bit line BL1. Meanwhile, the reference word line RWL1 is maintained in an inactive state by applying a "low" level thereto. Also, the word line WL0 and the reference word line RWL0 are maintained at a "low" level.

In the state that the wordline WL1 is active and the data signal and the inversion data signal are applied, the plate voltage is applied to the bit lines BL0 and CBL0' determined as the plate line. Then, the bit lines BL0 and CBL0' determined as the plate line are made as a ground level, and the wordline WL1 is inactivated by a "low" level. Accordingly, in the event a "high" level is applied to the bit line BL1, the ferroelectric capacitor 312 is programmed to the state of S4 of FIG. 1, and in the event a "low" level is applied to the bit line BL1, the ferroelectric capacitor 312 is programmed to the state of S1 of FIG. 1. In summary, the reading/writing operations for the operation memory cell 310L and that for the operation memory cell 310R are performed in a complementary manner.

Figure 13:
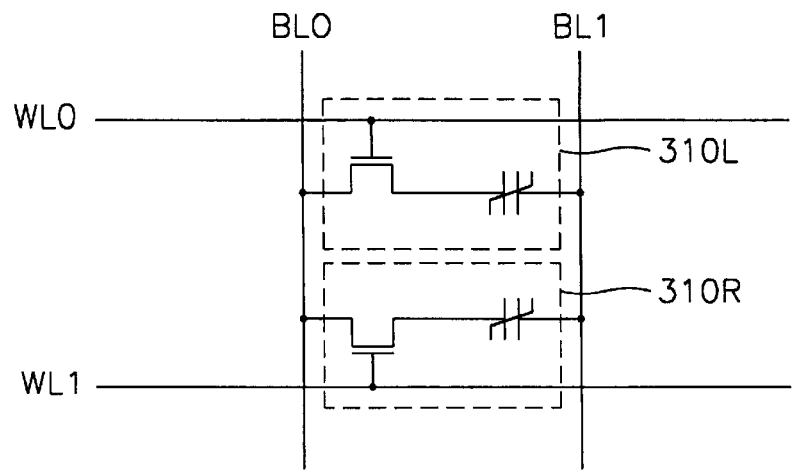
FIG. 13 is an electrical schematic of a pair of ferroelectric memory cells which can be used in the memory device of FIG. 12.
Figure 14:
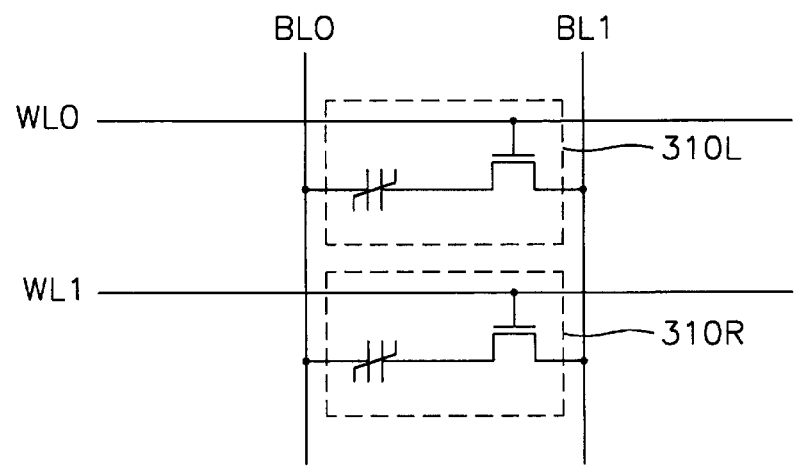
FIG. 14 is an electrical schematic of a pair of ferroelectric memory cells which can be used in the memory device of FIG. 12.
Figure 15:
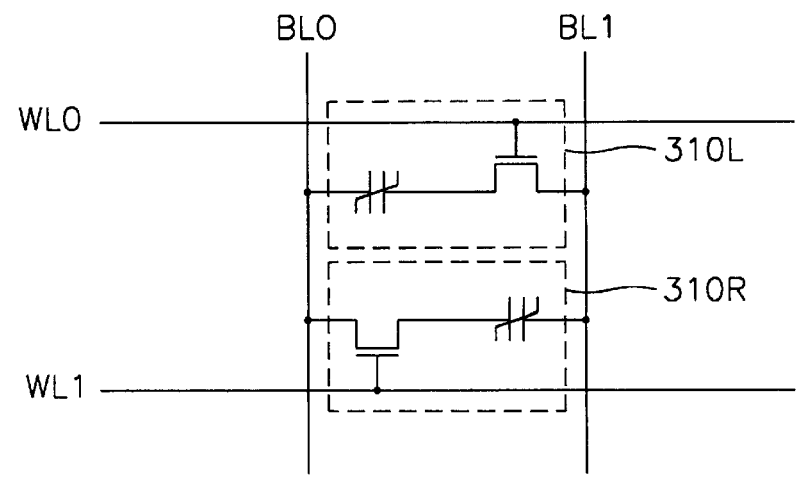
FIG. 15 is an electrical schematic of a pair of ferroelectric memory cells which can be used in the memory device of FIG. 12.

FIGS. 13 through 15 show other structures of an operation memory cell shown in FIG. 12. In FIG. 13, access transistors of the operation memory cells 310L and 310R are connected to the bit line BL0 and the ferroelectric capacitors are connected to the bit line BL1. Here, the access transistors are activated by a "high" level during a reading/writing operation of data, to connect the corresponding ferroelectric capacitor to the bit lines BL0 and BL1 through a drain/source path. Accordingly, even in the event the positions of the access transistor and the ferroelectric capacitor are changed relative to FIG. 12, the reading/writing operations are not substantively changed. Referring to FIG. 14, in the operation memory cells 310L and 310R, each of first drain/sources of the access transistors is connected to the bit line BL1, and each of the ferroelectric capacitors is connected between the bit line BL0 and a second drain/source of the corresponding access transistor. In FIG. 15, the access transistor of the operation memory cell 310L is connected to the bit line BL1 and the corresponding ferroelectric capacitor is connected between the access transistor and the bit line BL0. The access transistor of the operation memory cell 310R is connected to the bit line BL0, and the corresponding ferroelectric capacitor is connected between the access transistor and the bit line BL1. In the case of accessing the operation memory cell 310L, the word line WL0 is activated by a "high" level, and in the case of accessing the operation memory cell 310R, the word line WL1 is activated by a "high" level.

Figure 16:
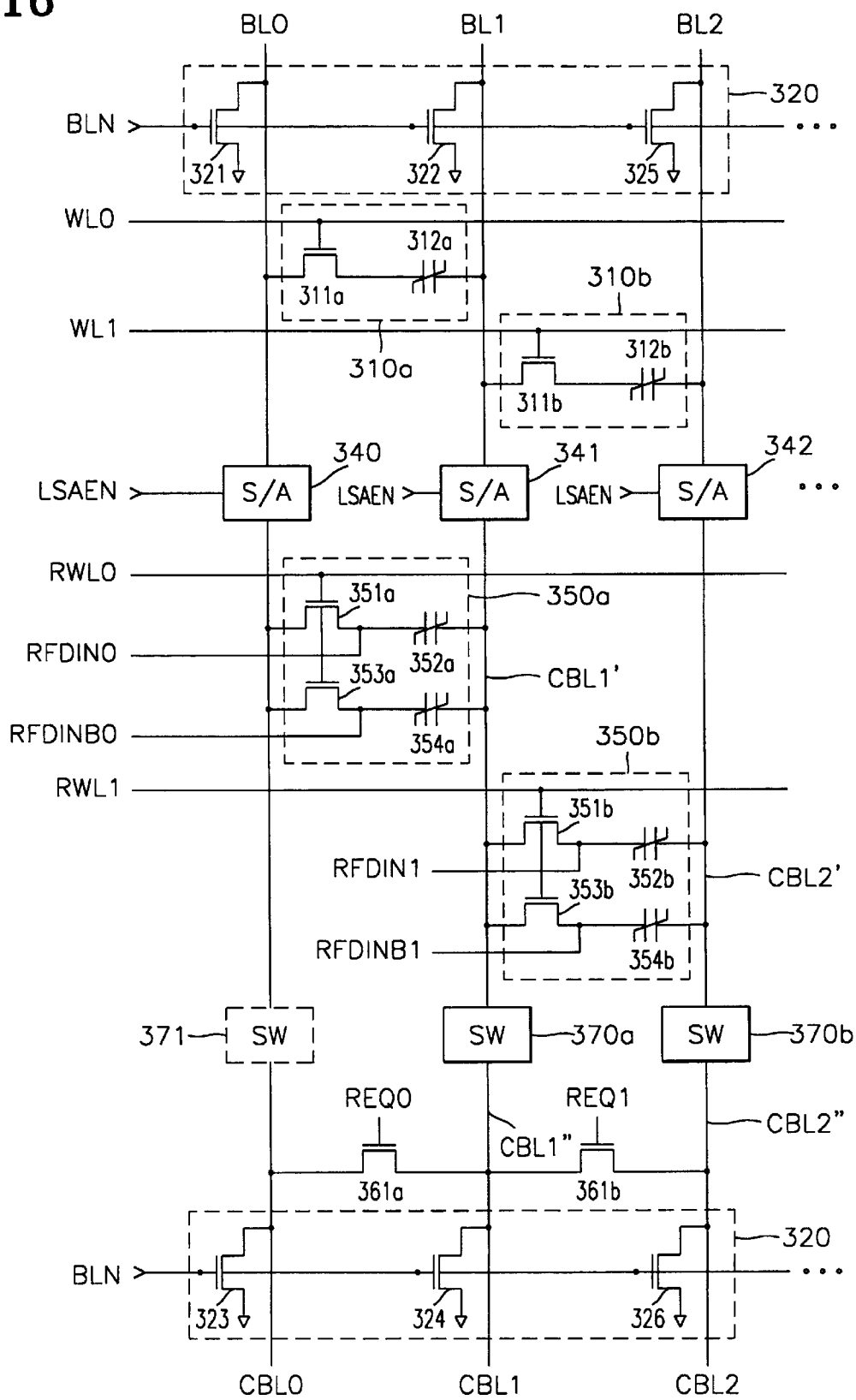
FIG. 16 is an electrical schematic of a ferroelectric memory device according to an embodiment of the present invention.

FIG. 16 shows a nonvolatile ferroelectric memory device according to another embodiment of the present invention. In FIG. 16, an operation memory cell 310a includes an access transistor 311a and a ferroelectric capacitor 312a, and an operation memory cell 310b includes an access transistor 311b and a ferroelectric capacitor 312b. The first drain/source of the access transistor 311a is connected to the bit line BL0, the second drain/source thereof is connected to the ferroelectric capacitor 312a, and the gate thereof is connected to a word line WL0. The ferroelectric capacitor 312a is connected between the second drain/source of the access transistor 311a and the bit line BL1. The first drain/source of the access transistor 311b is connected to the bit line BL1, the second drain/source thereof is connected to the ferroelectric capacitor 312b, and the gate thereof is connected to a word line WL1. The ferroelectric capacitor 311b is connected between the second drain/source of the access transistor 311b and the bit line BL2. If the access transistors consist of NMOS transistors, then a "high" level voltage can be used to connect bit lines to respective ferroelectric capacitors.

A reference cell 350a consists of two reference cell access transistors 351a and 353a and two reference cell ferroelectric capacitors 352a and 354a, and a reference cell 350b consists of two reference cell access transistors 351b and 353b and two reference cell ferroelectric capacitors 352b and 354b. The reference cell access transistors 351a and 353a are connected to the bit line BL0, and each of the reference cell ferroelectric capacitors 352a and 354a is connected between a corresponding reference cell access transistor and the bit line BL1. The reference cell access transistor 351b and 353b are connected to the bit line BL1, and each of the reference cell ferroelectric capacitors 352b and 354b is connected between a corresponding reference cell access transistor and the bit line BL2.

In FIG. 16, a reading operation for the operation memory cell 310a is performed as follows. In order to access an operation memory cell 310a, the bit line BL0 is determined as a data line, the bit line CBL0 is determined as an inversion data line, and bit lines BL1 and CBL1 are determined as plate lines. An isolation switch 370a is turned off, and the other isolation switches (e.g., 371 and 370b) are still turned on. Accordingly, the bit line CBL1 is divided into a portion CBL1' connected to the reference cell 350a and a portion CBL1" not connected thereto. In the event the bit line precharge enable signal BLN is set at a high level, each of the bit lines is precharged by a ground level through NMOS transistors 321, 322, 323, 324, 325 and 326 included in the bit line precharging portion 320. In this state, when the bit line precharge enable signal BLN becomes a "low" level, the bit lines are set to floating states.

A "high" level is then applied to the word line WL0 and the reference word line RWL0, to thereby turn on the access transistor 311a and the reference cell access transistors 351a and 353a. Accordingly, the ferroelectric capacitor 312a is electrically connected to the bit line BL0, and the reference cell ferroelectric capacitors 352a and 354a are electrically connected to the bit line CBL0. Here, access transistors included in the other operation memory cells and reference cell access transistors included in the other reference cells are in their turned-off states. Accordingly, the ferroelectric capacitors included in the other operation memory cells and the reference cells are not unnecessarily exposed to an operation cycle.

In the state that the access transistor 311a and the reference cell access transistors 351a and 353a are turned on, when a bit line equalizer enable signal REQ0 is activated by a "high" level, an NMQS transistor 361a is turned on to electrically connect the bit lines CBL0 and CBL141 . Here, the bit lines CBL0 and CBL1" act as inversion data lines which in combination have approximately twice the capacitance as the bit line BL0. The bit line CBL1' also acts as a plate line. Also, the other bit line equalizer enable signal REQ1 is inactivated by a "low" level so that bit line CBL1 is electrically disconnected from bit line CBL2.

A plate voltage is then applied to the bit lines BL1 and CBL1' determined as the plate line, so that a voltage corresponding to the data stored in the ferroelectric capacitor 312a appears on the bit line BL0. Because of the plate voltage, an intermediate level voltage signal appears on the inversion data line CBL0. As described above with respect to FIGS. 8 and 12, the intermediate level voltage signal is obtained by applying the positive plate line voltage to CBL1' and simultaneously reading the state of reference cell capacitor 352a (i.e., data 1) and reference cell capacitor 354a (i.e., data 0).

The voltages to be applied to the bit lines BL1 and CBL1' are then set to a ground level. Then, the bit line equalizer enable signal REQ0 is inactivated by a "low" level to disconnect the bit lines CBL0 and CBL1". Also, the reference word line RWL0 is inactivated by a "low" level to disconnect the reference cell ferroelectric capacitors 352a and 354a from the bit line CBL0. Then, a sense amplifier enable signal LSAEN is activated by a "high" level. The sense amplifier 340 amplifies a difference in voltage between the bit line BL0 and the inversion bit line CBL0. At this time, the bit line BL1 is set to a ground level in order to restore the data of the operation memory cell 310a so that a destructive read operation does not occur. The voltage levels of the bit lines BL0 and CBL0 are amplified by the sense amplifier and output as the data signal and the inversion data signal, respectively. Then, the reference word line RWL0 becomes set to a "low" level to disconnect the bit line CBL0 from the reference cell ferroelectric capacitors 352a and 354a. A "high" level is applied to a reference cell data line RFDINO, a "low" level is applied to an inversion reference cell data line RFDINBO, and a plate voltage (e.g., 5 volts) is applied to the bit line CBL1' determined as a plate line, to restore the states of the reference cell capacitors. Thus, when the bit line CBL1' becomes a ground level and the reference cell data line RFDINO and the reference cell inversion data line RFDINBO are grounded, data "1" and "0" are restored in the reference cell ferroelectric capacitors 352a and 354a. After the reading operation, the bit line precharge enable signal BLN is set to a "high" level to precharge the bit lines at a ground level, and a word line WL0 for the operation memory cell is inactivated by a "low" level.

During a writing operation of the operation memory cell 310a, the bit line BL0 is determined as a data line, the bit line CBL0 is determined as an inversion data line, and the bit lines BL1 and CBL1' are determined as a plate line. Also, an isolation switch 370a is turned off, and the other isolation switches are left on. The bit line precharge enable signal BLN is inactivated by a "low" level to turn-off NMOS transistors 321, 322, 323, 324, 325 and 326. Accordingly, the bit lines BL0, BL1, BL2, CBL0, CBL1 and CBL2 are floated. Then, a data signal to be written is applied to the bit line BL0 determined as the data line, and an inversion data signal is applied to the bit line CBL0 determined as the inversion data line. At this time, the sense amplifier enable signal LSAEN is activated by a "high" level, to enable the sense amplifier 340 to operate. In order to access the operation memory cell 310a, the word line WL0 is activated by a "high" level to electrically connect the ferroelectric capacitor 312a to the bit lines BL0 and BL1. Meanwhile, the reference word lines RWL are maintained in an inactive state by a "low" level. Also, the other word lines are continuously maintained in an inactive state by a "low" level.

When the word line WL0 is active and a data signal and an inversion data signal are applied, a plate voltage is applied to the bit lines BL1 and CBL1' determined as the plate lines. Here, the bit lines BL1 and CBL1' are set to a ground level. Accordingly, if a "high" level is applied to the bit line BL0, the ferroelectric capacitor 312a is programmed to the state of S4 of FIG. 1, and if a "low" level is applied to the bit line BL0, the ferroelectric capacitor 312a is programmed to the state of S1 of FIG. 1.

Referring still to FIG. 16, the reading operation for the operation memory cell 310b will be performed as follows. In order to access the operation memory cell 310b, the bit line BL1 is determined as a data line, the bit line CBL1 is determined as an inversion data line and the bit lines BL2 and CBL2 are determined as plate lines. An isolation switch 370b is turned off, and the other isolation switches are left on. Accordingly, bit line CBL2 is electrically divided into a portion CBL2' connected to a reference cell 350b and a portion CBL2" not connected thereto. In the event the bit line precharge enable signal "BLN" is set at a "high" level, each of the bit lines is precharged into a ground level through NMOS transistors 321, 322, 323, 324, 325 and 326 included in the bit line precharging portion 320. In this state, when the bit line precharge enable signal BLN becomes a "low" level, the bit lines are set to floating states.

The word line "WL1" and the reference word line "RWL1" are then activated to a "high" level, and accordingly the access transistor 311b and the reference cell access transistors 351b and 353b are turned on. Accordingly, the ferroelectric capacitor 312b is electrically connected to the bit lines BL1 and BL2, and the reference cell ferroelectric capacitors 352b and 354b are electrically connected to the bit line CBL1'.

In the state that the access transistor 311b and the reference cell access transistors 351b and 353b are turned on, when the bit line equalizer enable signal REQ1 is activated by a "high" level, an NMOS transistor 316b is turned on to electrically connect the bit lines CBL1 and CBL2". Here, the bit lines CBL1 and CBL2" act as inversion data lines which in combination have approximately twice the capacitance as the bit line BL1. The bit line CBL2' also acts as a plate line. Also, the other bit line equalizer enable signal REQ0 is maintained at a low level so that bit line CBL0 is disconnected from bit line CBL1. A plate voltage is then applied to the bit lines BL2 and CBL2' determined as the plate lines, so that a voltage level corresponding to the data stored in the ferroelectric capacitor 312b appears on the bit line BL1. Because of the plate voltage, an intermediate level voltage appears on the inversion data line CBL1.

Subsequently, the voltage applied to the bit lines BL2 and CBL2' decreases to a ground level. Then, a bit line equalizer enable signal REQ1 is inactivated by a "low" level to disconnect the bit lines CBL1 and CBL2". Also, the reference word line RWL1 is inactivated by a "low" level to disconnect the reference cell ferroelectric capacitors 352b and 354b from the bit line CBL1. Further, a sense amplifier enable signal LSAEN is activated by a "high" level. The sense amplifier 341 amplifies a voltage difference between the bit line BL1 acting as a data line and the bit line CBL1 acting as an inversion data line. At this time, the bit line BL2 is set to a ground level in order to restore the data of the operation memory cell 310b. Voltage levels on the bit lines BL1 and CBL1 are amplified by the sense amplifier and output as a data signal and an inversion data signal, respectively. Then, the reference word line RWL1 becomes set to a "low" level to disconnect the bit line CBL1 from the reference cell ferroelectric capacitors 352b and 354b. A "high" level is applied to the reference cell data line RFDIN1, a "low" level is applied to an inversion reference cell data line RFDINB1, and then a plate voltage (e.g., 5 Volts) is applied to a bit line CBL2' determined as the plate line, to restore the states of the reference cell capacitors. Thus, when the bit line CBL2' becomes a ground level and the reference cell data line RFDIN1 and reference cell inversion data line RFDINB1 are grounded, data "1" and "0" are restored in the reference cell ferroelectric capacitors 352b and 354b. After the reading operation, the bit line precharge enable signal BLN is set to a "high" level to precharge the bit lines to the ground level, and the word line WL1 for the operation memory cell is inactivated by a "low" level.

An operation for writing the operation memory cell 310b with data will now be described. First, the bit line BL1 is determined as a data line, the bit line CBL1 is determined as an inversion data line and the bit lines BL2 and CBL2 are determined as plate lines. Also, an isolation switch 370b is turned off, and the other isolation switches are maintained in their turned-on states. The bit line precharge enable signal BLN is inactivated by a "low" level to float bit lines BL0, BL1, BL2, CBL0, CBL1 and CBL2. Subsequently, a data signal to be written is applied to the bit line BL1 determined as the data line, and an inversion data signal is applied to the bit line CBL1 determined as the inversion data line. At this time, the sense amplifier enable signal LSAEN is activated by a "high" level to enable the sense amplifier 341 to operate. For accessing the operation memory cell 310b, the word line WL1 is activated by a "high" level to electrically connect the ferroelectric capacitor 312b to the bit lines BL1 and BL2. Meanwhile, the reference word lines are maintained in an inactive state and the other word lines are maintained in an inactive state. When the word line WL1 is active and a data signal and an inversion data signal are applied, a plate voltage is applied to the bit lines BL2 and CBL2' determined as the plate lines. Here, the bit lines BL2 and CBL2' become grounded. Accordingly, if a "high" level is applied to the bit line BL1, the ferroelectric capacitor 312b is programmed to the state of S4 of FIG. 1, and if "low" level is applied to the bit line BL1, the ferroelectric capacitor 312b is programmed to the state of S1 in FIG. 1.

In FIG. 16, in the event the bit line CBL0 acts as the plate line, the isolation switch 371 is turned off. Also, in the event the bit line BL2 is determined as the data line, and the bit line CBL2 is determined as the inversion data line, the sense amplifier 342 amplifies a difference in voltage between the bit lines BL2 and CBL2. Here, according to externally applied address information, the data line, the inversion data line and the plate line can be selectively determined, one of a plurality of word lines can be selectively activated, one of the reference word lines can be selectively activated, a plurality of isolation switches can be selectively turned on/off and a plurality of equalizers can be selectively turned on.

Figure 17:
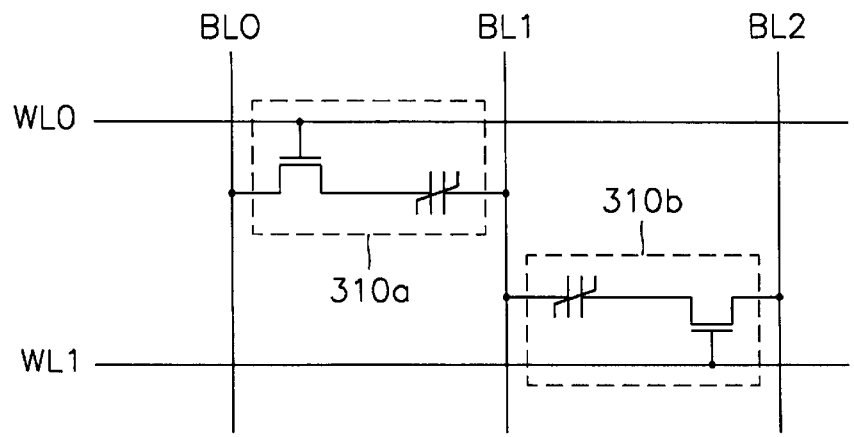
FIG. 17 is an electrical schematic of a pair of ferroelectric memory cells which can be used in the memory device of FIG. 16.
Figure 18:
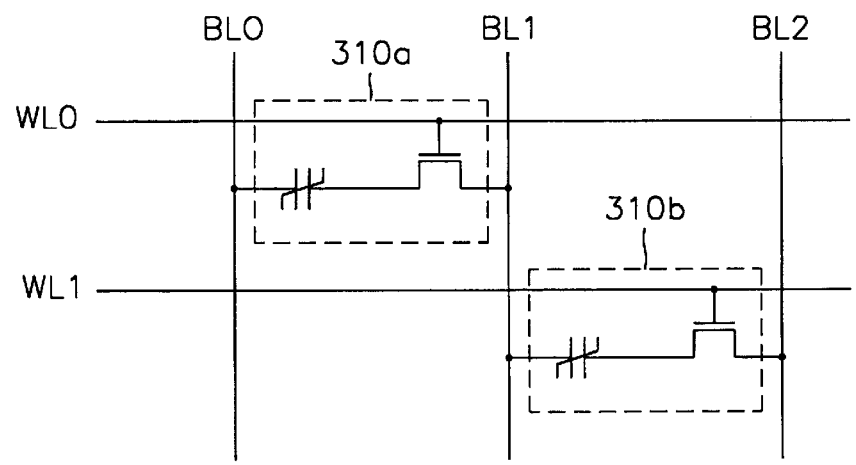
FIG. 18 is an electrical schematic of a pair of ferroelectric memory cells which can be used in the memory device of FIG. 16.
Figure 19:
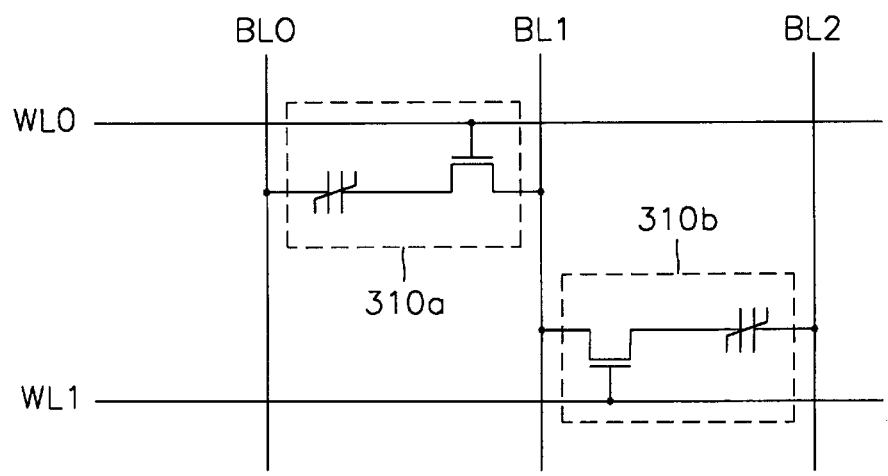
FIG. 19 is an electrical schematic of a pair of ferroelectric memory cells which can be used in the memory device of FIG. 16.

FIGS. 17 through 19 show other structures of the operation memory cells shown in FIG. 16. In FIGS. 17 through 19, each of access transistors is activated by a "high" level during a reading/writing operation of data such that a corresponding ferroelectric capacitor is connected to bit lines through a drain/source path. Accordingly, even if the positions of the access transistor and the ferroelectric capacitor are exchanged with each other, the data reading/writing operation is not changed. Referring to FIG. 17, an access transistor of an operation memory cell 310a is connected to a bit line BL0, and a ferroelectric capacitor is connected to a bit line BL1. An access transistor of an operation memory cell 310b is connected to the bit line BL1, and a ferroelectric capacitor is connected to the bit line BL2. Referring to FIG. 18, an access transistor of an operation memory cell 310a is connected to a bit line BL1, and a ferroelectric capacitor is connected to a bit line BL0. An access transistor of an operation memory cell 310b is connected to a bit line BL2, and a ferroelectric capacitor is connected to the bit line BL1. Referring to FIG. 19, an access transistor of an operation memory cell 310a is connected to a bit line BL1, and a ferroelectric capacitor is connected to a bit line BL0. An access transistor of an operation memory cell 310b is connected to the bit line BL1, and a ferroelectric capacitor is connected to a bit line BL2. In FIGS. 17 through 19, in order to access the operation memory cell 310a, the bit line BL0 is determined as a data line, the bit line BL1 is determined as a plate line, and a word line WL0 is activated by a "high" level. In the case that the operation memory cell 310b is accessed, the word line WL1 is activated by a "high" level, the bit line BL1 is determined as the data line, and the bit line BL2 is determined as the plate line.

Figure 20:
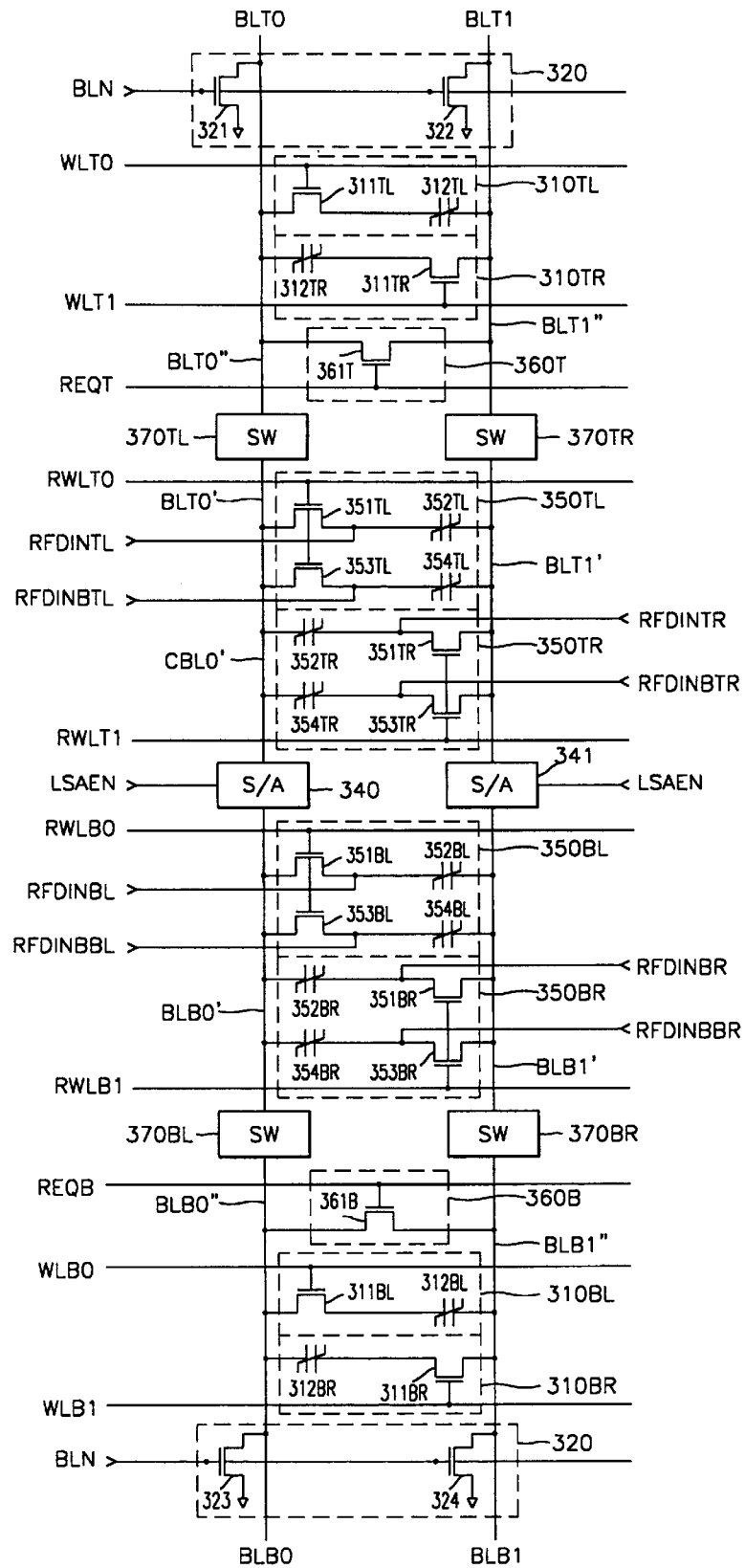
FIG. 20 is an electrical schematic of a ferroelectric memory device according to an embodiment of the present invention.

FIG. 20 shows a nonvolatile ferroelectric memory device according to a further embodiment of the present invention. FIG. 20 shows an open bit line structure. This embodiment is similar to the embodiment of FIG. 12, however the operation memory cells are connected about a common sense amplifier. In FIG. 20, an operation memory cell 31GTL consists of an access transistor 311TL and a ferroelectric capacitor 312TL, an operation memory cell 310TR consists of an access transistor 311TR and a ferroelectric capacitor 312TR, an operation memory cell 310BL consists of an access transistor 311BL and a ferroelectric capacitor 312BL, and an operation memory cell 310BR consists of an access transistor 311BR and a ferroelectric capacitor 312BR. Also, the operation memory cells 310TL, 310TR, 310BL and 310BR are connected between the bit lines corresponding thereto, respectively.

A reference cell 350TL consists of two reference cell access transistors 351TL and 353TL and two reference cell ferroelectric capacitors 352TL and 354TL. A reference cell 350TR consists of two reference cell access transistors 351TR and 353TR and two reference cell ferroelectric capacitors 352TR and 354TR. A reference cell 350BL consists of two reference cell access transistors 351BL and 353BL and two reference cell ferroelectric transistors 352BL and 354BL. A reference cell 350BR consists of two reference cell access transistors 351BR and 353BR and two reference cell ferroelectric capacitors 352BR and 354BR. In a manner similar to that of FIG. 12, the reference cell 350BL is for accessing the operation memory cell 310TL, the reference cell 350BR is for accessing the operation memory cell 310TR, the reference cell 350TL is for accessing the operation memory cell 310BL, and the reference cell 350TR is for accessing the-operation memory cell 310BR.

Accordingly, in the event an operation for reading the operation memory cell 310TL is to be performed, the reference word line RWLB0 is activated by a "high" level, and in the event an operation for reading the operation memory cell 310TR is to be performed, the reference word line RWLB1 is activated by a "high" level. Also, in the case of performing a reading operation for the operation memory cell 310BL, the reference word line RWLT0 is activated by a "high" level, and in the case of performing a reading operation for the operation memory cell 310BR, the reference word line RWLT1 is activated by a "high" level. Reference characters RFDINTL and RFDINBTL respectively indicate a reference cell data line and an inversion reference cell data line for the reference cell 350TL. Reference characters RFDINTR and RFDINBTR respectively indicate a reference cell data line and an inversion reference cell data line for the reference cell 350TR. Also, reference characters RFDINBL and RFDINBBL respectively indicate a reference cell data line and an inversion reference cell data line for the reference cell 350BL. Reference characters RFDINBR and RFDINBBR respectively indicate a reference cell data line and an inversion reference cell data line for the reference cell 350BR.

Data is stored in the state of polarization of the ferroelectric capacitors 312TL, 312TR, 312BL and 312BR of the operation memory cells, and the operation memory cells are accessed by selectively activating corresponding wordlines WLT0, WLT1, WLB0 and WLB1. As described more fully hereinbelow, reading and writing data in the operation memory cell 310TL can be performed using operations similar to those described with respect to the reading and writing of data in the operation memory cell 310L in FIG. 12. In particular, the ferroelectric memory device of FIG. 20 is similar to the device of FIG. 12, however, the device of FIG. 20 is more highly integrated than the device of FIG. 12 because four memory cells (i.e., 310TL, 310TR, 310BL and 310BR) are included for every two sense amplifiers 340 and 341, whereas in the device of FIG. 12, only two memory cells (310L and 310R) are included for the two sense amplifiers 340 and 341. The similarity in operation can also be illustrated by comparing word line WLT0 in FIG. 20 with WL0 in FIG. 12, memory cell 310TL with 310L, sense amplifier 340 with 340, signal lines RWLB0, RFDINBL and RFDINBBL with RWL0, RFDINL and RFDINBL, reference cell 350BL with 350L, isolation switch 370BL in FIG. 20 with 371 in FIG. 12, isolation switch 370BR in FIG. 20 with 370 in FIG. 12 and bit line equalizer 360B in FIG. 20 with 260 in FIG. 12.

In the case of performing a reading and writing operation for the operation memory cell 310TL, the bit line BLT0 acts as a data line, the bit line BLB0 acts as an inversion data line, and the bit lines BLT1 and BLB1 act as plate lines. Here, the bit lines BLT0 and BLB0 can also be considered as a single bit line having segments BLT0", BLT0', BLB0' and BLB0" and the bit lines BLT1 and BLB1 can be considered as a single bit line having segments BLT1", BLT1', BLB1' and BLB1". In particular, in the case of a reading operation, in order to double the bit line capacitance of the inversion data line BLB0, an isolation switch 370BR is turned off. Accordingly, the bit line BLB1 is divided into a portion BLB1" connected to the reference cell 350BL and a portion BLB1" not connected thereto. Also, the bit line equalizer enable signal REQB is activated by a "high" level to turn on NMOS transistor 361B and electrically connect the bit line BLB0 to the bit line BLB1". Accordingly, the bit line BLB1' acts as the plate line, and the bit lines BLB1" and BLB0 act as the inversion data lines.

In the case of performing a data reading and writing operation for the operation memory cell 310TR, the bit line BLT1 acts as a data line, the bit line BLB1 acts as an inversion data line, and the bit lines BLT0 and BLB0 act as plate lines. In the reading operation, an isolation switch 370BL is turned off to divide the bit line BLB0 into portions BLB0' and BLB0".

In the case of performing a data reading and writing for the operation memory cell 310BL, the bit line BLB0 acts as a data line, the bit line BLT0 acts as an inversion data line, and the bit lines BLB1 and BLT1 act as plate lines. In the reading operation, an isolation switch 370TR is turned off to divide the bit line BLT1 into portions BLT1' and BLT1".

In the case of performing a data reading and writing for the operation memory cell 310BR, the bit line BLB1 acts as a data line, the bit line BLT1 acts as an inversion data line, and the bit lines BLB0 and BLT0 act as plate lines. In the reading operation, an isolation switch 370TL is turned off to divide the bit line BLT0 into portions BLT0' and BLT0".

A bit line precharging portion 320 consists of NMOS transistors 321, 322, 323 and 324. Each NMOS transistor has a drain connected to a bit line, a source connected to ground and a gate connected to the precharge enable signal line BLN. The bit line precharging portion 320 precharges the bit lines before the data reading and writing operations are performed.

A bit line equalizer 360T consists of one NMOS transistor 361T, and a bit line equalizer 360B consists of one NMOS transistor 361B. In the case of performing the reading operation for the operation memory cells 310BL and 310BR, the bit line equalizer 360T is turned on, and in the case of performing the reading operation for the operation memory cells 310TL and 310TR, the bit line equalizer 360B is turned on. That is, in the case of performing the reading operation for the operation memory cells 310BL and 310BR, the bit line equalizer enable signal REQT is activated by a "high" level, and in the case of performing the reading operation for the operation memory cells 310TL and 310TR, the bit line equalizer enable signal REQB is activated by a "high" level.

The isolation switches 370TL, 370TR, 370BL and 370BR are selectively turned off, as described above. When the isolation switches are turned off, the corresponding bit line is divided electrically into a portion or segment connected to a reference cell and a portion or segment connected to an operation memory cell. Accordingly, a plate voltage applied for operating a reference cell is not applied to another operation memory cell which is not being accessed. Finally, in the case that a sense amplifier enable signal LSAEN is active, sense amplifiers 340 and 341 amplify a difference in voltage between the bit lines connected thereto.

Figure 21:
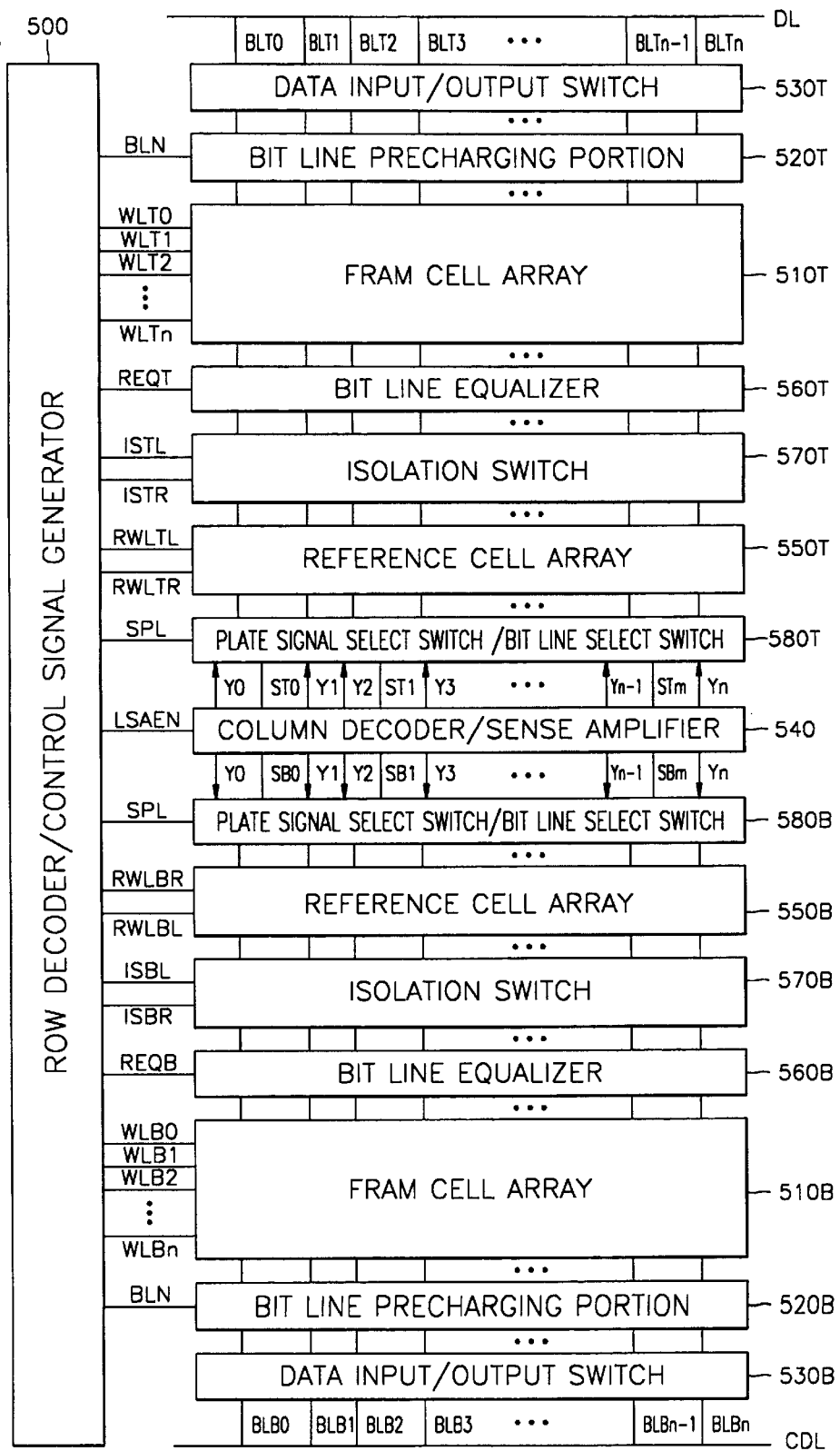
FIG. 21 is an electrical schematic of a ferroelectric memory device according to an embodiment of the present invention.

FIG. 21 shows a nonvolatile ferroelectric memory device according to another embodiment of the present invention. Referring to FIG. 21, a nonvolatile ferroelectric memory device includes a row decoder/control signal generator 500, data input/output switches 530T and 530B, bit line precharging portion 520T and 520B, operation memory cell arrays 510T and 510B, bit line equalizers 560T and 560B, isolation switches 570T and 570B, reference cell arrays 550T and 550B, plate line selection switch/bit line selection switches 580T and 580B and a column decoder/sense amplifier 540. In FIG. 21, the row decoder/control signal generator 500 decodes a row address applied externally to selectively activate one of a plurality of word lines WLT0, WLT1, . . . , WLTN, WLB0, WLB1, WLB2, . . . , WLBN and selectively activate one of a plurality of reference word lines RWLTL, RWLTR, RWLBL and RWLBR. Also, a plurality of control signals for controlling reading and writing operations are generated in the row decoder and control signal generator 500. The column decoder/sense amplifier 540 decodes a column address applied externally to amplify a difference in voltage between the bit lines connected to the sense amplifier enable signal LSAEN which is active. In the plate line selection switch/bit line selection switches 580T and 580B, a data line, an inversion data line and a plate line are determined during the reading and writing operations.

Figure 22:
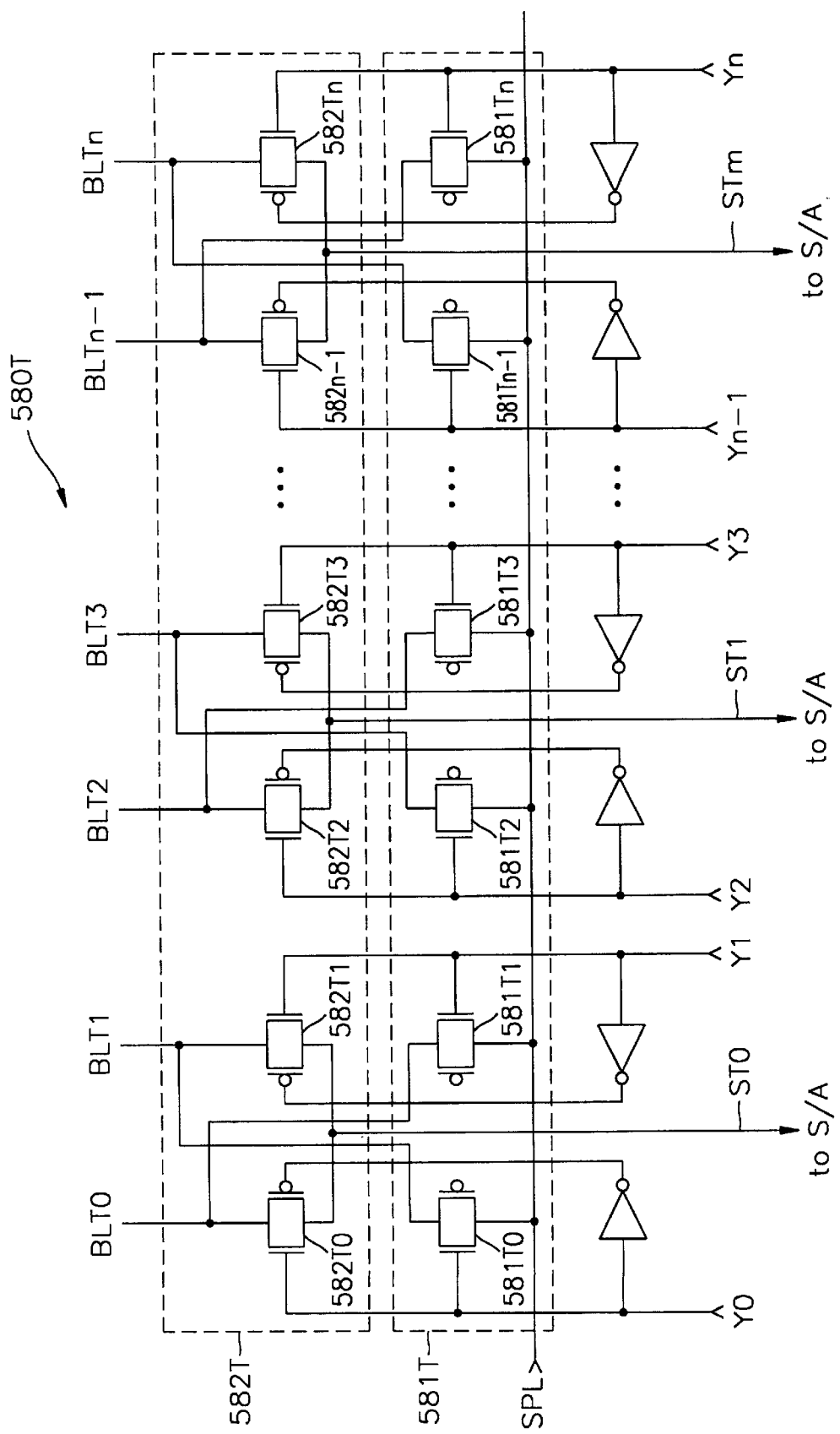
FIG. 22 is a detailed electrical schematic of the top plate line selection switch/bit line selection switch 580T of FIG. 21.
Figure 23:
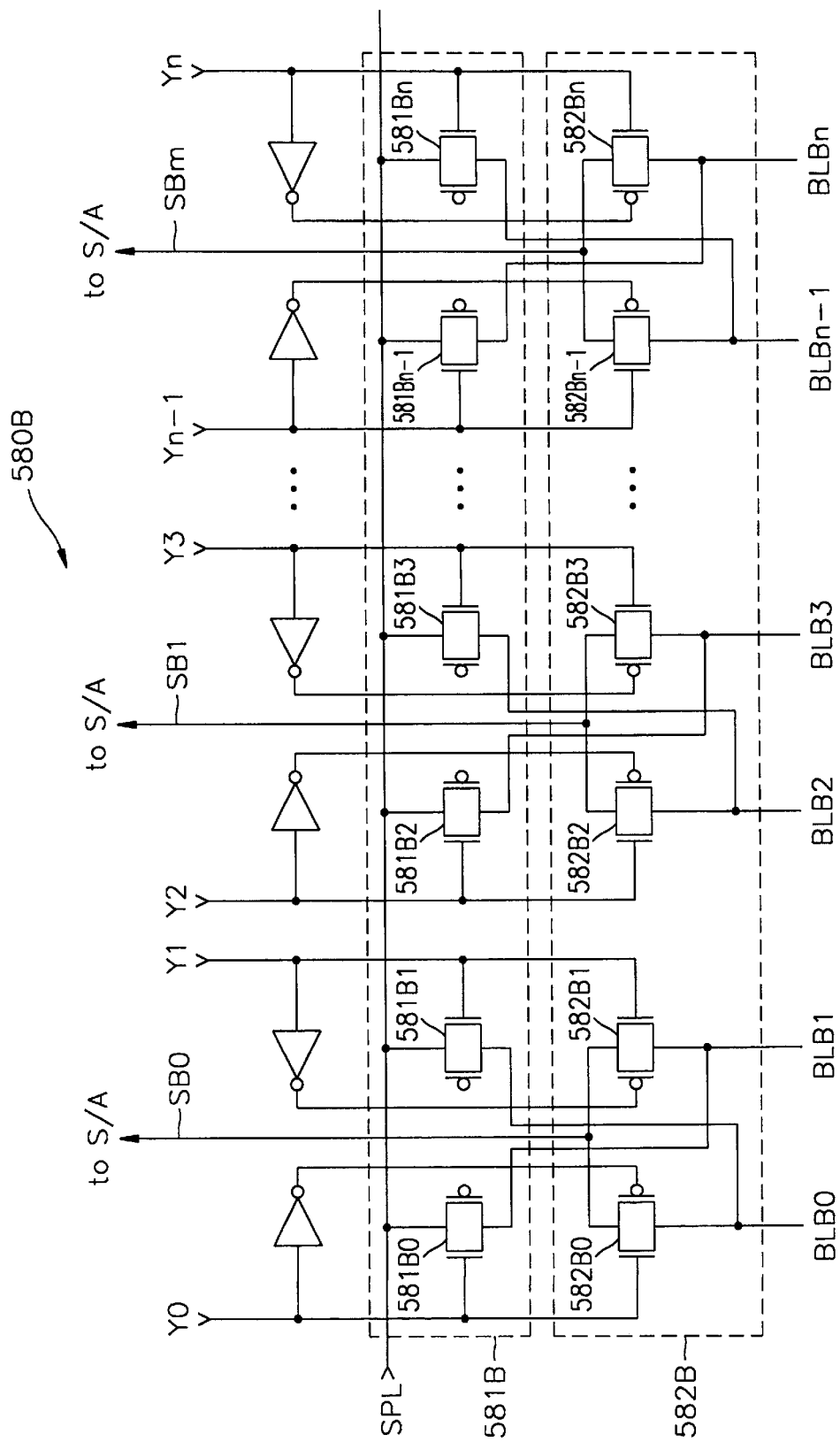
FIG. 23 is a detailed electrical schematic of the bottom plate line selection switch/bit line selection switch 580B of FIG. 21.

FIG. 22 shows a detailed circuit diagram of a plate line selection switch/bit line selection switch 580T of FIG. 21, and FIG. 23 shows a detailed circuit diagram of a plate line selection switch/bit line selection switch 580B of FIG. 21. Referring to FIG. 22, a plate line selection switch 581T consists of a plurality of transmission gates. In the case of corresponding column selection signals which are active, each transmission gate connects a plate voltage line SPL to a bit line corresponding thereto. That is, when the column selection signal Y0 is activated by a "high" level, the transmission gate 581T0 is turned on to electrically connect the plate voltage line SPL to the bit line BLT1. When the column selection signal Y1 is activated by a "high" level, the transmission gate 581T1 is turned on to electrically connect the plate voltage line SPL to the bit line BLT0. The other plate voltage lines and bit lines are also switched in the same way. Here, only one of the column selection signals Y0, Y1, Y2, Y3, . . . , Yn-1 and Yn is selectively activated. Accordingly, only one of a plurality of transmission gates included in the plate line selection switch 581T is selectively turned on, and only one of a plurality of bit lines BLT0, BLT1, BLT2, BLT3, . . . , BLTn-1 and BLTn is selectively determined as a plate line. Alternatively, the plate voltage line SPL can be simultaneously coupled to BLT1, BLT3, BLT5, . . . , BLTn so that multiple memory cells in the same row can be accessed (read or written to) simultaneously.

A bit line selection switch 582T consists of a plurality of transmission gates, and each of the transmission gates is activated as a column select signal corresponding thereto is in a "high" level. That is, when the column selection signal Y0 is activated by a "high" level, the transmission gate 582T0 is turned on to electrically connect a sense amplifier line ST0 to the bit line BLT0. At this time, the other transmission gates included in the bit line selection switch 582T are turned off. Also, in the case that the column selection signal Y1 is activated by a "high" level, the transmission gate 582T1 is turned on to electrically connect the sense amplifier line ST0 to the bit line BLT1. The other transmission gates included in the bit line selection switch 582T operate in the same manner. Thus, the sense amplifier line ST0 is selectively connected to one of the bit lines BLT0 and BLT1, the sense amplifier line ST1 is selectively connected to one of the bit lines BLT2 and BLT3, and the sense amplifier line STm is selectively connected to one of the bit lines BLTn-1 and BLTn. Accordingly, in FIG. 22, when the column selection signal Y0 is active, the bit line BLT0 is connected to the sense amplifier line ST1 and the bit line BLT1 is connected to the plate voltage line SPL. That is, the bit line BLT0 is determined as a data line or an inversion data line, and the bit line BLT1 is determined as a plate line.

FIG. 23 shows a detailed circuit diagram of a plate line selection switch/bit line selection switch 580B of FIG. 21. In FIG. 23, a plate line selection switch 581B consists of a plurality of transmission gates, and a bit line selection switch 582B also consists of a plurality of transmission gates. When the column selection signal Y0 is activated by a "high" level, the transmission gates 581B0 and 582B0 are turned on to electrically connect the plate voltage line SPL to the bit line BLB1 and electrically connect the sense amplifier line SB0 to the bit line BLB0. That is, the bit line BLB1 is determined as a plate line, and the bit line BLB0 is determined as a data line or an inversion data line. When the column selection signal Y1 is activated by a "high" level, the transmission gates 581B1 and 582B1 are turned on to electrically connect the plate voltage line SPL to the bit line BLB0 and electrically connect the sense amplifier line SB0 to the bit line BLB1. Also, when the column selection signal Yn is activated by a "high" level, the transmission gates 581Bn and 582Bn are turned on to electrically connect the plate voltage line SPL to the bit line BLBn-1 and electrically connect the sense amplifier line SBm to the bit line BLBn. The other transmission gates operate in the same manner.

Accordingly, as illustrated by FIG. 12, a preferred embodiment of the present invention may comprise a plurality of data memory cells (e.g., 310L, 310R) which each contain an access transistor (e.g., 311L, 311R) and a ferroelectric capacitor (e.g., 312L, 312R) therein. A plurality of bit lines BL0–Bln are also provided. A first bit line (e.g., BL0 & CBL0) is preferably electrically connected to a first access transistor (e.g., 311L) in a first data memory cell (e.g., 310L) and a second bit line (e.g., BL1 & CBL1) is preferably electrically connected to a first ferroelectric capacitor (e.g., 312L) in the first data memory cell. The gate of the first access transistor is also electrically connected to a word line (e.g., WL0). A first reference circuit (e.g., 350L) is also preferably provided. The first reference circuit preferably contains first and second reference memory cells electrically coupled in parallel between the first bit line and the second bit line. In particular, the first reference memory cell may contain an access transistor (e.g., 351L) electrically connected to the first bit line and a ferroelectric capacitor (e.g., 352L) electrically coupled in series between the respective access transistor and the second bit line (e.g., BL1). The second reference memory cell may contain an access transistor (e.g., 353L) electrically connected to the first bit line and a ferroelectric capacitor (e.g., 354L) electrically coupled in series between the respective access transistor and the second bit line (e.g., BL1). The first and second bit lines may each contain a plurality of bit line segments. For example, the first bit line (e.g., BL0) may be formed of at least three segments including an upper segment, an intermediate segment (e.g., CBL0') and a bottom segment (e.g., CBL0"). First and second sense amplifiers (e.g., 340, 341) may also be provided in series between the upper and intermediate segments, respectively, of the first and second bit lines. First and second isolation switches (e.g., 371, 370) may also be provided between the intermediate and bottom segments, respectively, of the first and second bit lines. A bit line equalizing circuit (e.g., 361) may also be provided between the bottom segments (e.g., CBL0", CBL1 ") of the first and second bit lines. Similarly, as illustrated best by FIG. 20, the first and second bit lines may each contain four segments {(BLT0, BLT1), (BLT0', BLT1'), (BLB0', BLB1'), (BLB0", BLB1")}. As illustrated best by FIGS. 22 and 23, a preferred integrated circuit memory device may also comprise means, coupled to a plurality of bit lines, for configuring bit lines as plate lines by selectively electrically coupling first ones of the plurality of bit lines to a sense amplifier and second ones of the plurality of bit lines to a plate line (e.g., SBL), in response to a column select signal (e.g., Y0–Yn).

Figure 24:
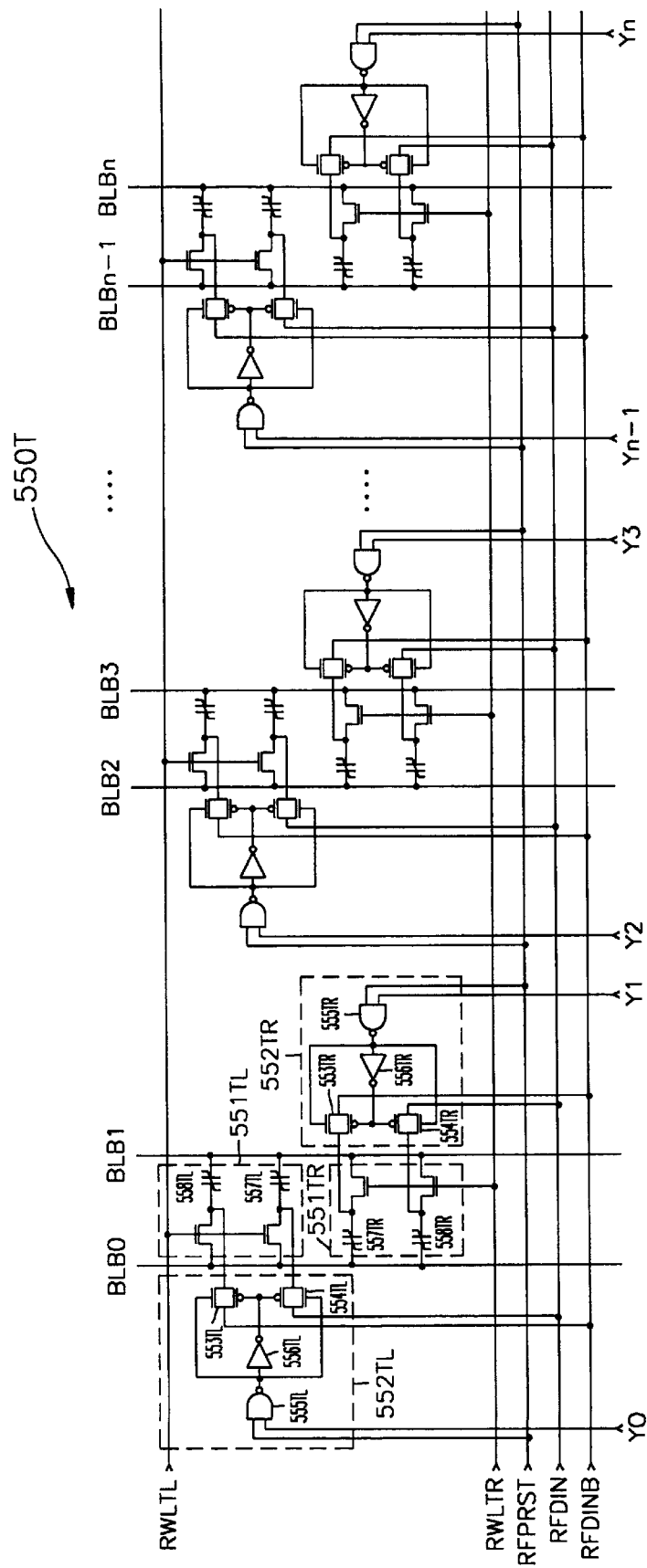
FIG. 24 is a detailed electrical schematic of the top reference cell array 550T of FIG. 21.
Figure 25:
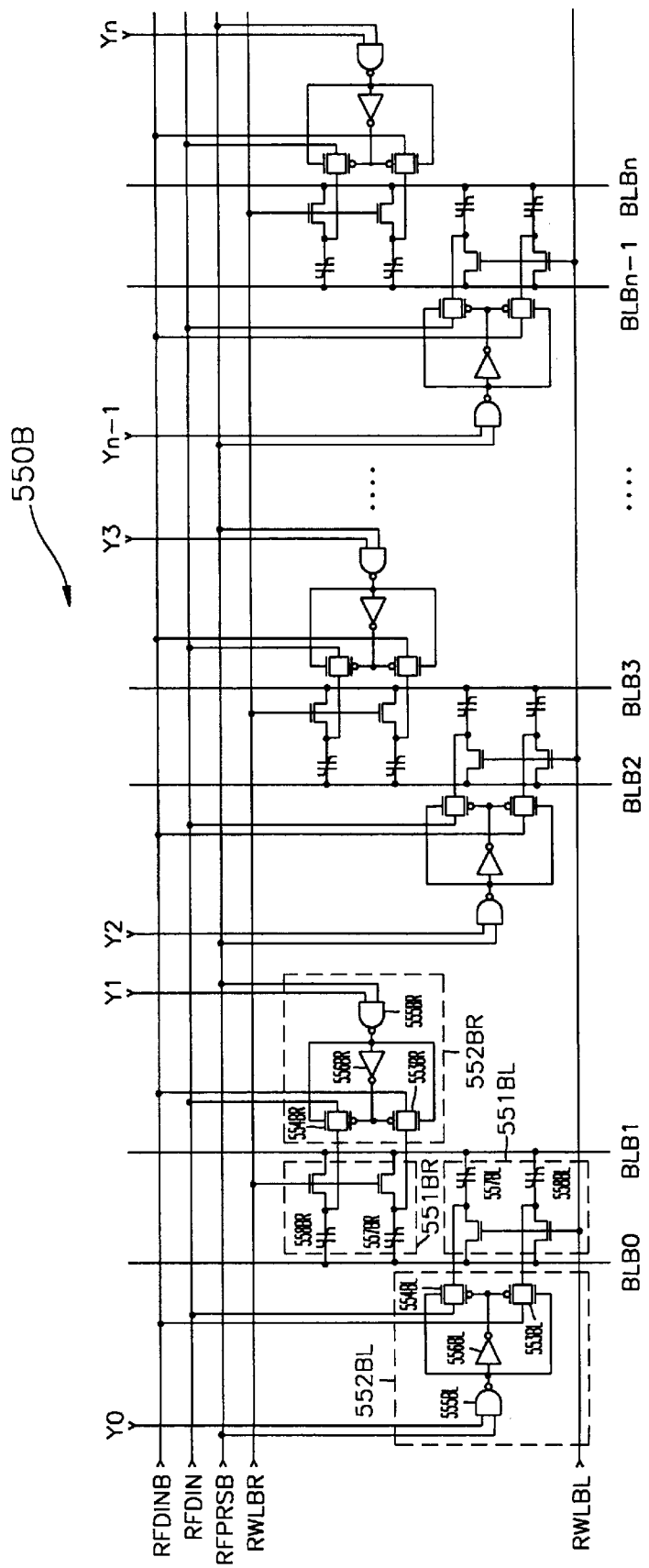
FIG. 25 is a detailed electrical schematic of the bottom reference cell array 550B of FIG. 21.

A detailed circuit of the reference cell array 550T of FIG. 21 is shown in FIG. 24, and a detailed circuit of the reference cell array 550B is shown in FIG. 25. Referring to FIG. 24, a reference cell 551TL which consists of two reference cell access transistors and two reference cell ferroelectric capacitors, is connected between the bit lines BLT0 and BLT1 and accessed in the case of a reference word line RWLTL of a "high" level. A reference cell data writing controller 552TL for controlling writing of data for the reference cell 551TL consists of a NAND gate 555TL, an inverter 556TL and transmission gates 553TL and 554TL. In the case that the column selection signal Y0 is activated by a "high" level and a reference cell data gate signal RFPRST is activated by a "high" level, the NAND gate 555TL outputs a signal of a "low" level. The inverter 556TL inverts the output of the NAND gate 555TL. In the case that the output of the NAND gate 555TL is a "low" level, the transmission gate 553TL is turned on to electrically connect an inversion reference cell data line RFDINB to a ferroelectric capacitor. 558TL, and in the case that the output of the NAND gate 555TL is a "low" level, the transmission gate 554TL is turned on to electrically connect a reference cell data line RFDIN to a ferroelectric capacitor 557TL.

A reference cell 551TR which consists of two reference cell access transistors and two reference cell ferroelectric capacitors, is connected between the bit lines BLT0 and BLT1 and accessed in the case that the reference word line RWLTR is a "high" level. A reference cell data writing controller 552TR for controlling writing of data for the reference cell 551TR consists of a NAND gate 555TR, an inverter 556TR, and transmission gates 553TR and 554TR. In the case that a column selection signal Y1 is activated by a "high" level and a reference cell data gate signal RFPRST is activated by a "high" level, the NAND gate 555TR outputs a signal of a "low" level. The inverter 556TR inverts the output of the NAND gate 555TR. In the case that the output of the NAND gate 555TR is a "low" level, the transmission gate 553TR is turned on to electrically connect an inversion reference cell data line RFDINB to a ferroelectric capacitor 558TR, and in the case that the output of the NAND gate 555TR is a "low" level, the transmission gate 554TR is turned on to electrically connect a reference cell data line RFDIN to a ferroelectric capacitor 557TR. Thus, in the event operation memory cells connected between the bit lines BLB0 and BLB1 are accessed, reference cells 551TL and 551TR are selectively activated. That is, one reference cell is commonly used during reading operations for a plurality of operation memory cells.

Referring to FIG. 25, a reference cell 551BL consisting of two reference cell access transistors is connected between bit lines BLB0 and BLB1 and accessed in the case that a reference word line RWLBL is a "high" level. The other reference cells consist of two access transistors and two ferroelectric capacitors and are connected between bit lines corresponding thereto. Activated reference cells among a plurality of reference cells are determined according to a column selection signal and reference word lines.

A reference cell data writing controller 552BL consists of a NAND gate 555BL, an inverter 556BL and transmission gates 553BL and 554BL. In the case that a column selection signal Y0 is activated by a "high" level and a reference cell data gate signal RFPRSB is activated by a "high" level, the NAND gate 555BL outputs a signal of a "high" level. The inverter 556BL inverts the output of the NAND gate 555BL. In the case that the output of the NAND gate 555BL is a "high" level, the transmission gate 553BL is turned on to electrically connect an inversion reference cell data line RFDINB to a ferroelectric capacitor 558BL, and in the case that the output of the NAND gate 555BL is a "high" level, the transmission gate 554BL is turned on to electrically connect a reference cell data line RFDIN to a ferroelectric capacitor 557BL.

Figure 26:
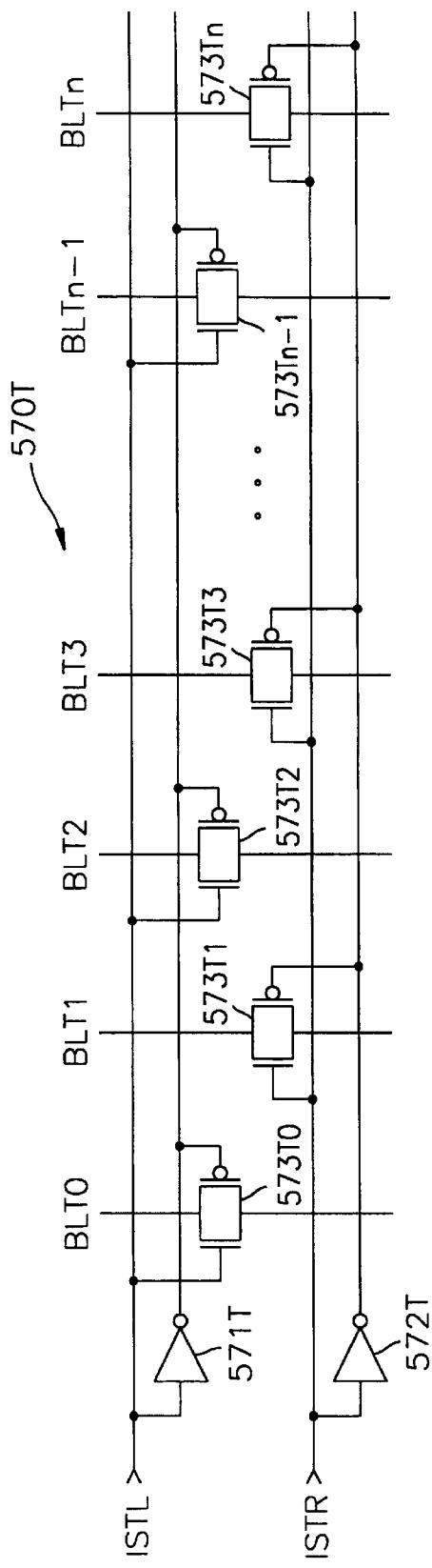
FIG. 26 is a detailed electrical schematic of the top isolation switch 570T of FIG. 21.
Figure 27:
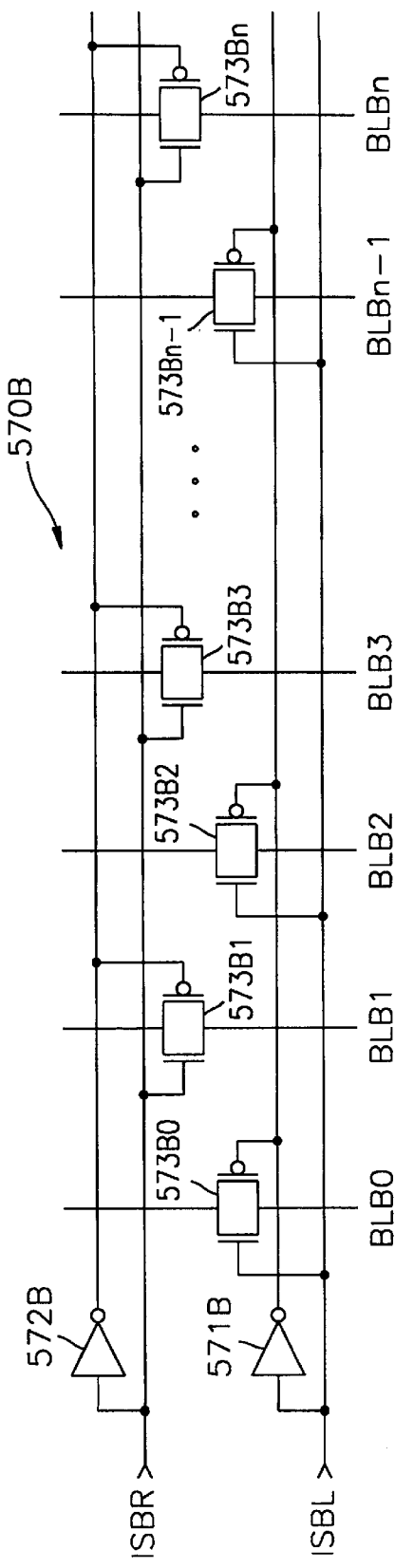
FIG. 27 is a detailed electrical schematic of the bottom isolation switch 570B of FIG. 21.

In FIG. 21, isolation switches 570T and 570B are located between an operation memory cell array and a reference cell array, respectively. FIG. 26 shows a detailed circuit of an isolation switch 570T of FIG. 21, and FIG. 27 shows a detailed circuit of an isolation switch 570B of FIG. 21. In FIG. 26, an isolation switch 570T consists of a plurality of transmission gates 573T0, 573T1, 573T2, 573T3, . . . , 573Tn−1, 573Tn and inverters 571T and 572T. The inverters 571T and 572T invert isolation switch control signals ISTL and ISTR, respectively. The transmission gate 573T0 is located on a bit line BLT0, and turned on in the case that the isolation switch control signal ISTL is activated by a "high" level. The transmission gate 573T1 is located on a bit line BLT1 and turned on in the case that isolation switch control signal ISTR is activated by a "high" level. In brief, in the case that the isolation switch control signal ISTL is active, the transmission gates 573T0, 573T2, . . . 573Tn−1 are turned on, and in the case that the isolation switch control signal ISTR is activated by a "high" level, the transmission gates 573T1, 573T3, . . . , 573Tn are turned on. That is, the transmission gate constituting the isolation switch, as described in FIG. 12, is connected to a reference cell and electrically divides a bit line connected to a reference cell and determined as a plate line into two portions.

In FIG. 27, an isolation switch 570B includes inverters 571B and 572B and a plurality of transmission gates 573B0, 573B1, 573B2, 573B3, . . . , 573Bn−1, 573Bn. In the case that an isolation switch control signal ISBL is active, the transmission gates 573B0, 573B2, . . . , 573Bn−1 are turned on, and in the case that the isolation switch control signal ISBR is activated by a "high" level, the transmission gates 573B1, 573B3, . . . , 573Bn are turned on.

Figure 28:
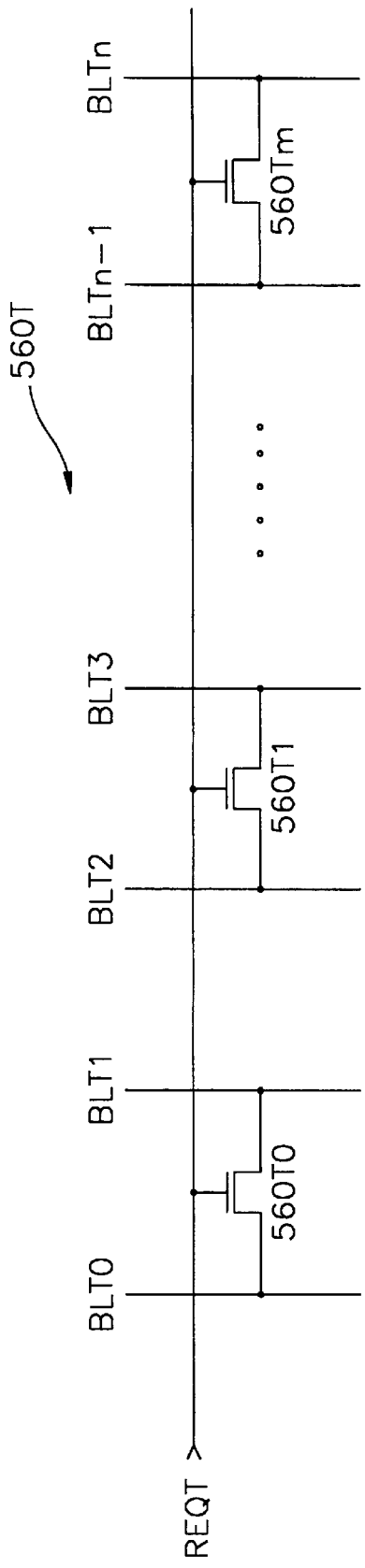
FIG. 28 is a detailed electrical schematic of the top bit line equalizer 560T of FIG. 21.
Figure 29:
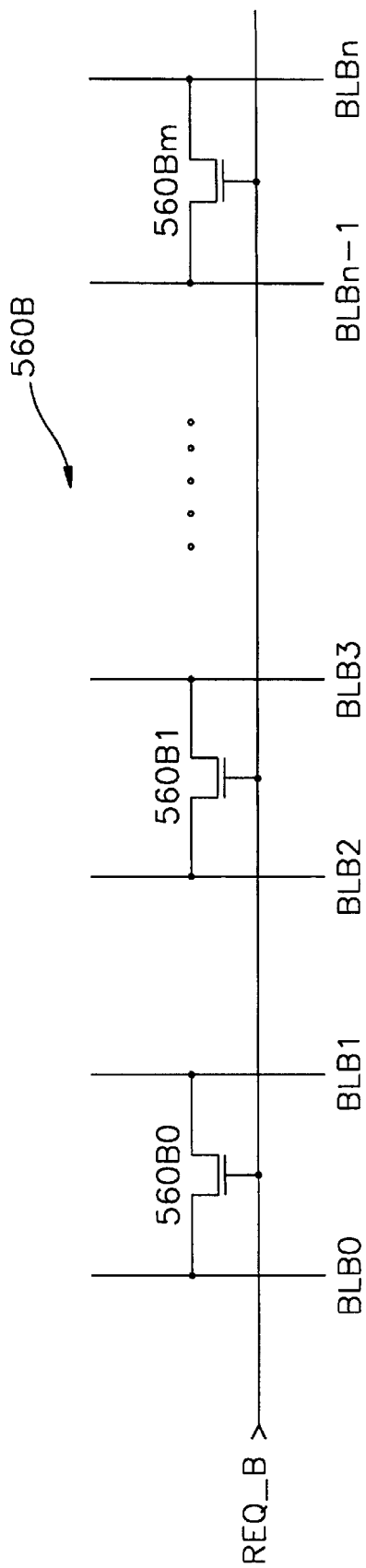
FIG. 29 is a detailed electrical schematic of the bottom bit line equalizer 560B of FIG. 21.

FIG. 28 shows a detailed circuit of a bit line equalizer 560T shown in FIG. 21, and FIG. 29 shows a detailed circuit of a bit line equalizer 560B shown in FIG. 21. In FIG. 28, a bit line equalizer 560T consists of a plurality of NMOS transistors. In the case that a bit line equalizer enable signal REQT is activated by a "high" level, the NMOS transistors 560T0, 560T1, . . . , 560Tm are turned on, to electrically connect bit lines corresponding thereto. That is, when the bit line equalizer enable signal REQT is activated by a "high" level, bit lines BLT0 and BLT1 are electrically connected, bit lines BLT2 and BLT3 are electrically connected, and the other pairs of bit lines also are electrically connected in the same way.

In FIG. 29, a bit line equalizer 560B consists of a plurality of NMOS transistors 560B0, 560B1, . . . , 560Bm. In the case that a bit line equalizer enable signal REQB is activated by a "high" level, the NMOS transistors 560B0, 560B1, . . . , 560Bm are turned on, to electrically connect bit lines corresponding thereto.

The bit line equalizer enable signals REQT and REQB of FIGS. 28 and 29 are activated by a "high" level in a reading operation of data. In the reading operation for the operation memory cell included in the operation memory cell array 510B of FIG. 21, the bit line equalizer enable signal REQT is activated by a "high" level and the bit line equalizer enable signal REQB is inactivated by a "low" level. Meanwhile, in the reading operation for the operation memory cell included in the operation memory cell array 510T of FIG. 21, the bit line equalizer enable signal REQT is maintained by an inactive state and the bit line equalizer enable signal REQB is activated by a "high" level. More detailed description is disclosed in the description for the reading operation.

Figure 30:
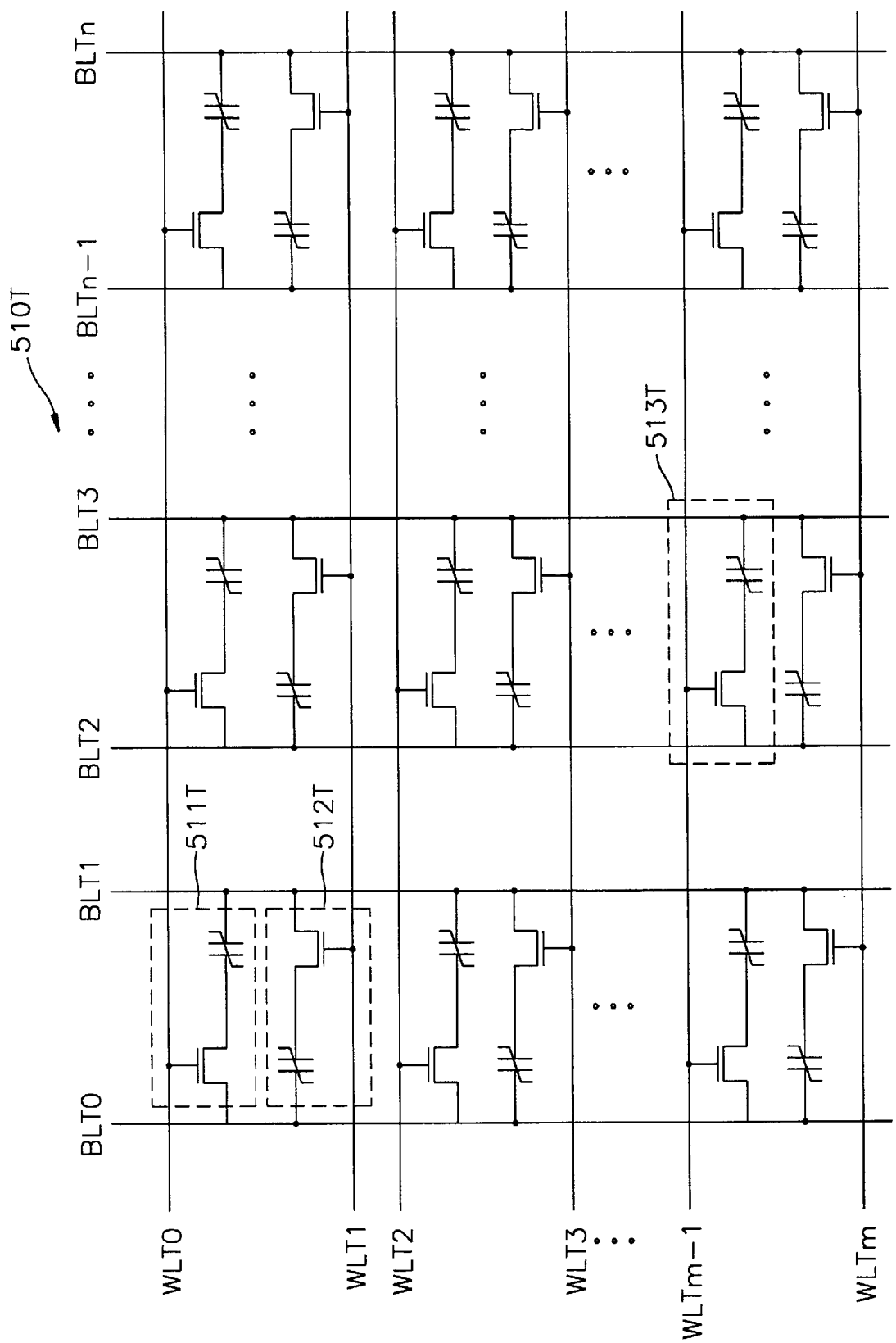
FIG. 30 is a detailed electrical schematic of the top ferroelectric memory cell array 510T of FIG. 21.

In FIG. 30, each of operation memory cell arrays 510T of FIG. 21, which consists of one access transistor and one ferroelectric capacitor, is connected between neighboring bit lines. Also, the gate of the access transistor is connected to a corresponding word line. In FIG. 30, the access transistor includes an NMOS transistor. In order to access an operation memory cell 511T, a word line WLT0 is activated by a "high" level, a bit line BLT0 is determined as a data line and a bit line BLT1 is determined as a plate line. Meanwhile, in order to access an operation memory cell 512T, a word line WLT1 is activated by a "high" level, the bit line BLT1 is determined as a data line and the bit line BLT0 is determined as a plate line. In order to access an operation memory cell 513T, a word line WLTm−1 is activated by a "high" level, the bit line BLT2 is determined as a data line and a bit line BLT3 is determined as a plate line. Access of the other operation memory cells is also performed in a similar manner. To sum up, in the case that the neighboring bit lines gain access to the operation memory cells connected therebetween, one of them acts as a data line and the other acts as a plate line.

Figure 31:
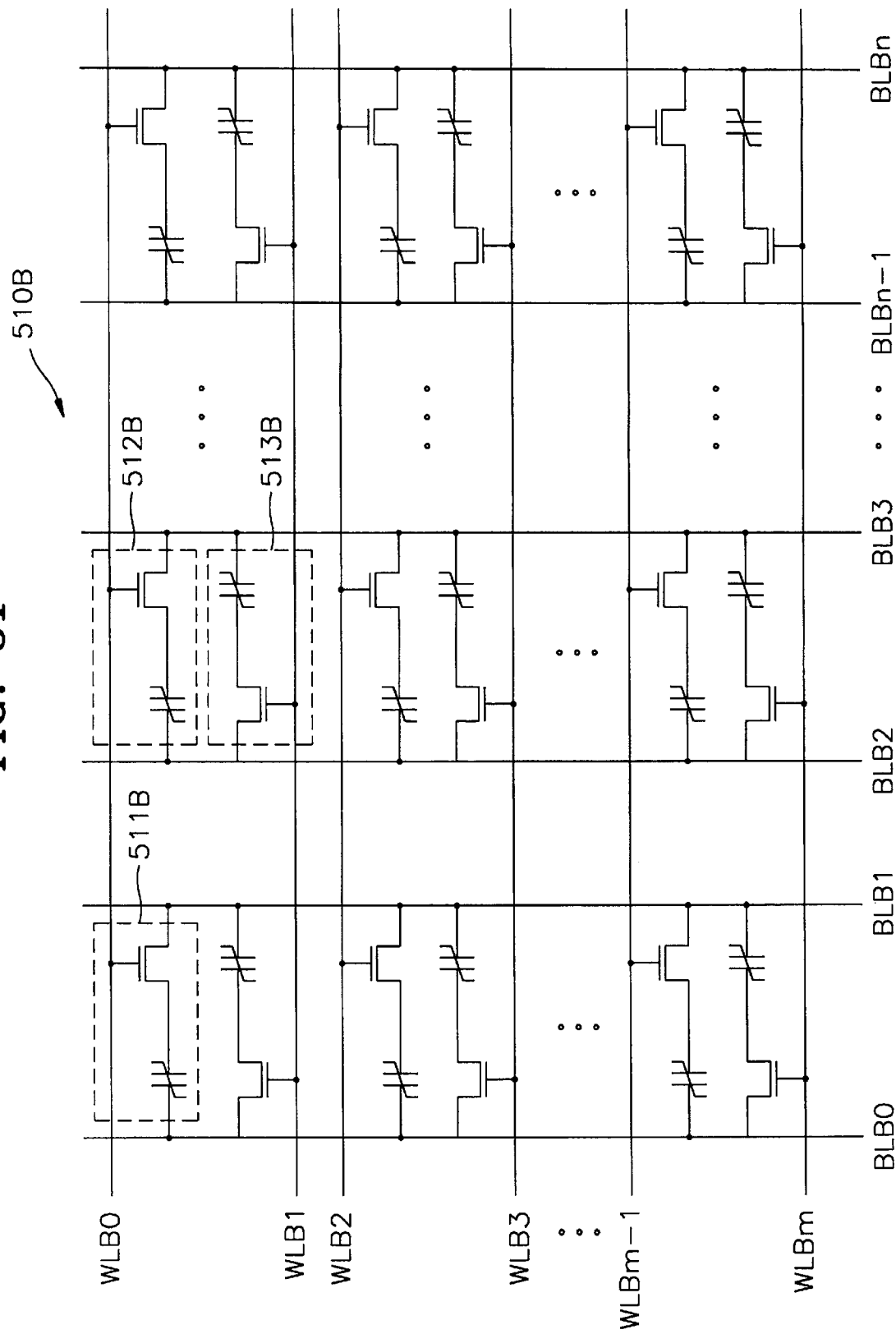
FIG. 31 is a detailed electrical schematic of the bottom ferroelectric memory cell array 510B of FIG. 21.

FIG. 31 is a detailed circuit diagram of an embodiment of an operation memory cell array 510B shown in FIG. 21. Referring to FIG. 31, each of the operation memory cells consists of one access transistor and one ferroelectric capacitor. Also, the access transistor includes an NMOS transistor. Reference characters BLB0, BLB1, BLB2, BLB3, . . . , BLBn−1, and BLBn indicate word lines. An operation memory cell 511B is connected between bit lines BLB0 and BLB1, and the gate of the access transistor is connected to a word line WLB0. An operation memory cell 512B is connected between bit lines BLB2 and BLB3, and the gate of the access transistor is connected to a word line WLB0. An operation memory cell 513B is connected between the bit lines BLB2 and BLB3, and the gate of the access transistor included in the operation memory cell 513B is connected to a word line WLB1.

In FIG. 31, in the case of accessing the operation memory cell 511B, the bit line BLB1 is determined as a data line and the bit line BLB0 is determined as a plate line. Also, in the case of accessing the operation memory cell 512B, the bit line BLB3 is determined as a data line and the bit line BLB2 is determined as a plate line. Meanwhile, in the case of accessing the operation memory cell 513B, the bit line BLB2 is determined as a data line and the bit line BLB3 is determined as a plate line. The other plate lines and bit lines are determined in the same way.

In FIGS. 30 and 31, one of a plurality of word lines WLT0, WLT1, WLT2, WLT3, . . . , WLTm−1, WLTm, WLB0, WLB1, WLB2, WLB3, . . . , WLBm−1, and WLBm is selectively activated. The word line can be selected by a row address applied externally.

Figure 32:
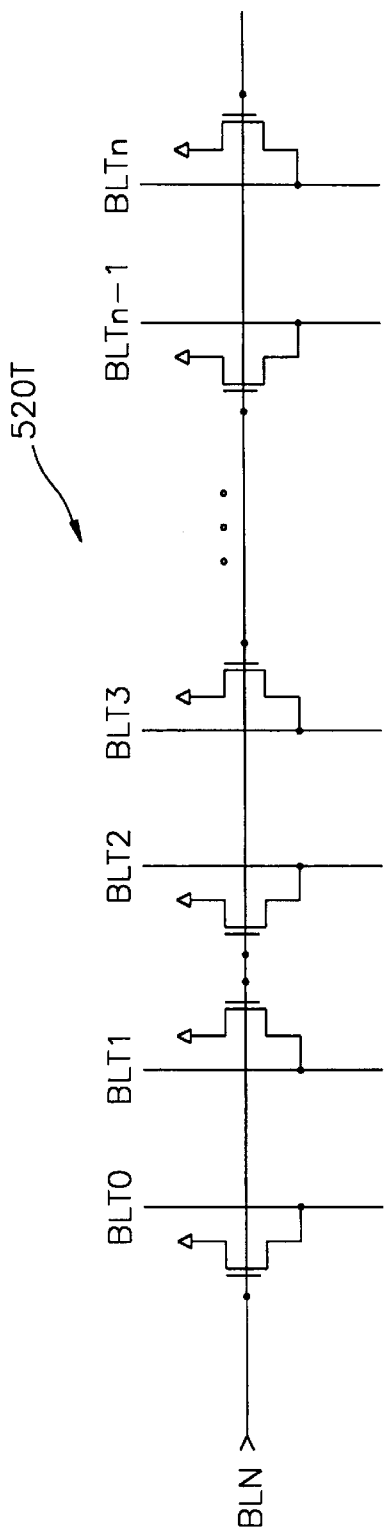
FIG. 32 is a detailed electrical schematic of the top bit line precharging circuit 520T of FIG. 21.
Figure 33:
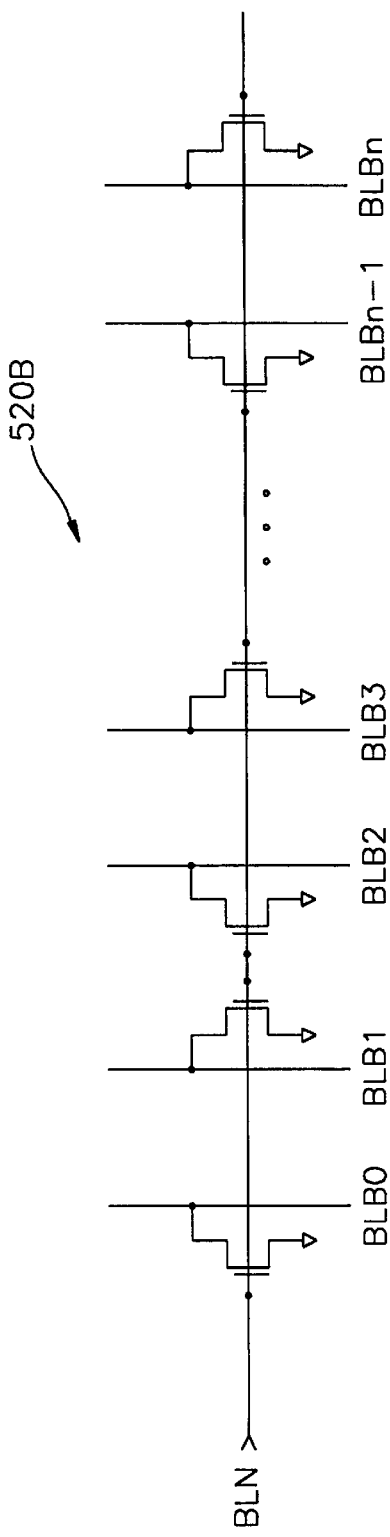
FIG. 33 is a detailed electrical schematic of the bottom bit line precharging circuit 520B of FIG. 21.

The detailed circuit of the bit line precharging portion 520T of FIG. 21 is shown in FIG. 32, and that of the bit line precharging portion 520B is shown in FIG. 33. In FIG. 32, the bit line precharging portion 520T consists of a plurality of transistors. Each of the NMOS transistors includes a gate to which a bit line precharge enable signal BLN is applied, a drain connected to a corresponding bit line and a grounded source. Accordingly, in the case that the bit line precharge enable signal BLN is activated by a "high" level, the bit lines BLT0, BLT1, BLT2, BLT3, . . . , BLTn−1, and BLTn are precharged to a ground level. In FIG. 33, the bit line precharging portion 520B consists of a plurality of NMOS transistors. Each of the NMOS transistors includes a gate to which the bit line precharge enable signal BLN is applied, a drain connected to a corresponding bit line and a grounded source. Accordingly, in the case that the bit line precharge enable signal BLN is activated by a "high" level, the bit lines BLB0, BLB1, BLB2, BLB3, . . . , BLBn−1, and BLBn are precharged to a ground level. Here, before reading and writing operation of data is performed, the bit line precharge enable signal BLN is activated by a "high" level so that the data line, the inversion line and the plate line are precharged to a ground level.

Figure 34:
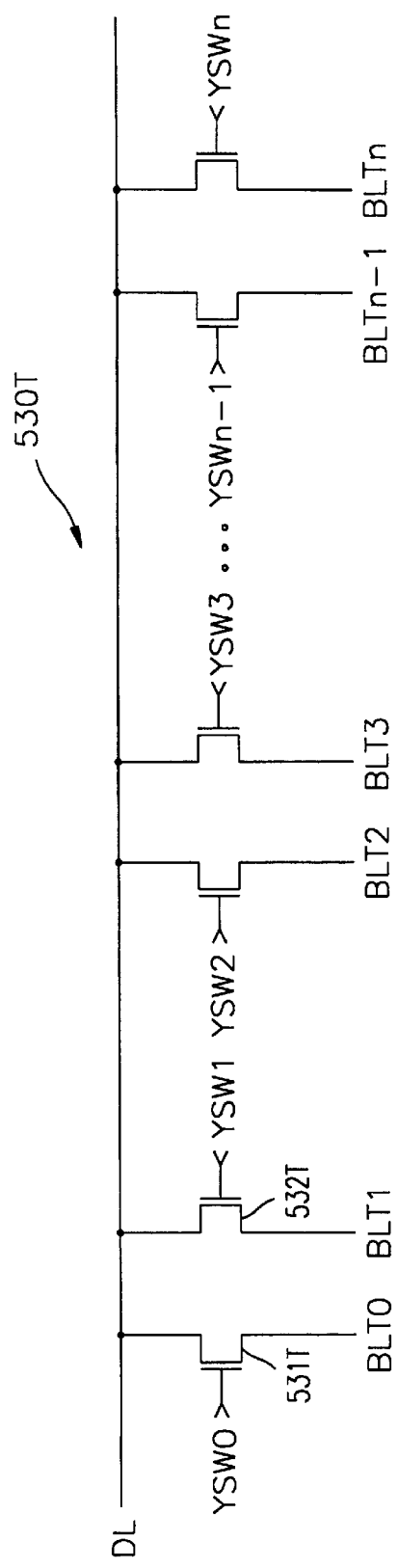
FIG. 34 is a detailed electrical schematic of the top data input/output switch 530T of FIG. 21.
Figure 35:
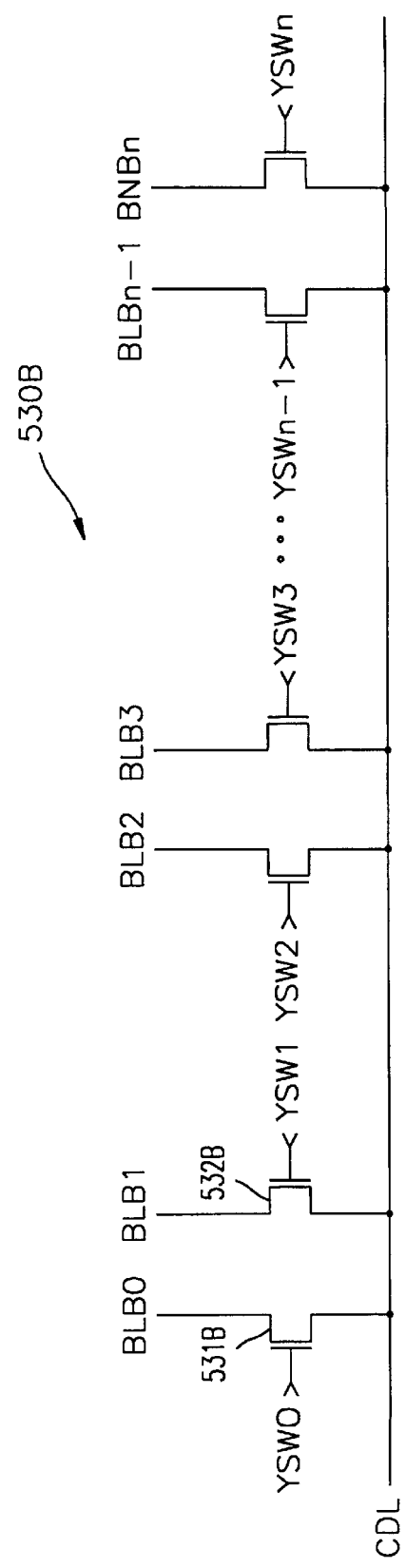
FIG. 35 is a detailed electrical schematic of the bottom data input/output switch 530B of FIG. 21.

An embodiment of the circuit of a data input/output switch 530T of FIG. 21 is shown in detail in FIG. 34, and that of a data input/output switch 530B thereof is shown in detail in FIG. 35. Referring to FIG. 34, the data input/output switch 530T consists of a plurality of NMOS transistors. Each of the NMOS transistors includes a gate to which a corresponding input/output switch signal is applied, a first drain/source connected to an input/output line DL, and a second drain/source connected to a corresponding bit line. In more detail, an NMOS transistor 531T includes a drain and a source connected to data input/output line DL and the bit line BLT0, respectively, and a gate to which the data input/output switch signal YSW0 is applied, and an NMOS transistor 532T includes a drain and a source connected to the data input/output line DL and the bit line BLT1, respectively. Here, one of a plurality of data input/output switch signals YSW0, YSW1, YSW2, YSW3, . . . , YSWn−1 and YSWn is selectively activated by a "high" level. Delayed column select signals Y0, Y1, Y2, Y3, . . . , Yn−1, Yn can be used for the data input/output switch signal, which is selectively activated according to a column address applied externally. That is, a column decoder 540 of FIG. 21 can generate a column select signal and a data input/output switch signal.

Referring to FIG. 35, the data input/output switch 530B consists of a plurality of NMOS transistors. Each of the NMOS transistors includes a gate receiving a corresponding data input/output switch signal, a first drain/source connected to a data input/output line CDL and a second drain/ source connected to a bit line. In more detail, an NMOS transistor 531B includes a drain and a source connected to the data input/output line CDL and the bit line BLB0, respectively and a gate receiving the data input/output switch signal YSW0, and an NMOS transistor 532B includes a drain and a source connected to the data input/output line CDL and the bit line BLTn, respectively, and a gate receiving the input/output switch signal YSWn. Here, one of a plurality of data input/output switch signals YSW0, YSW1, YSW2, YSW3, . . . , YSWn−1 and YSWn is selectively activated by a "high" level, which is the same as that described in FIG. 34.

In FIGS. 34 and 35, in the case that the data signal is input/output through the data input/output line DL, an inversion data signal is input/output through the input/output line CDL, and in the case that the inversion data signal is input/output through the data input/output line DL, the data signal is input/output through the data input/output line CDL. That is, the data input/output lines DL and CDL operate complimentarily.

Figure 36:
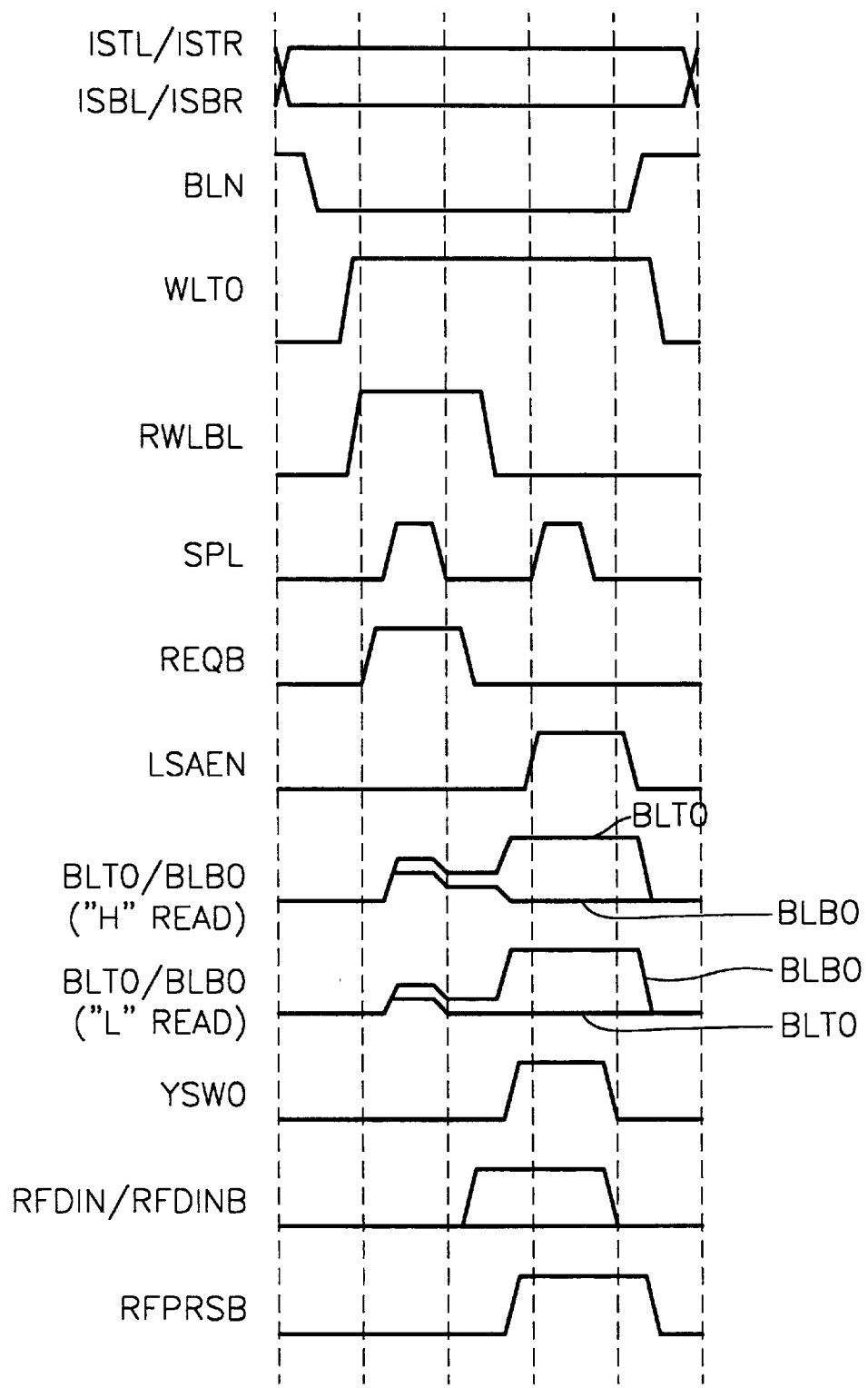
FIG. 36 is a timing diagram which illustrates a method of performing a reading operation on the memory device of FIG. 21.

FIG. 36 is a waveform diagram showing the reading operation of the nonvolatile ferroelectric memory device shown in FIGS. 21 through 35. The reading operation will be described as follows with reference to FIG. 36. First, according to column select signals Y0, Y1, Y2, Y3, . . . , Yn−1, and Yn output from a column decoder, a data line/inversion data line and a plate line are determined. Also, according to a row address and a column address which are applied externally, the levels of isolation switch control signals ISTL, ISTR, ISBL, and ISBR are changed.

For example, in the case of accessing the operation memory cell 511T of FIG. 30, the column select signal Y0 is activated by a "high" level. Accordingly, transmission gates 581T0 and 582T0 of FIG. 22 are turned on, and transmission gates 581B and 582B0 of FIG. 23 are turned on, to determine the bit lines BLT0 and BLB0 as a data line and an inversion data line, and the bit lines BLT1 and BLB1 as plate lines. Also, isolation switch control signals ISTL, ISTR, and ISBL are activated by a "high" level, and an isolation switch control signal ISBR is inactivated by a "low" level. Accordingly, the transmission gates 573T0 and 573T1 of FIG. 26 are turned on, the transmission gate 573B0 of FIG. 27 is turned on, and the transmission gate 573B1 is turned off, to thereby electrically divide the bit line BLB1 into two parts BLB1' and BLB1". Thus, an isolation switch located on the plate line connected to an accessed operation memory cell is turned on, and an isolation switch located on the plate line connected to a reference cell is turned off. Here, the isolation switch control signals can be generated according to the row address and the column address applied externally. For example, in FIG. 21, assuming that the operation memory cells having an uppermost bit of "0" in the row address are arranged in an upper portion of a sense amplifier, and those having an uppermost bit of "1" in the row address are arranged in a lower portion thereof, and also in the case that a lowermost bit of the column address is zero, the left one of a pair of bit lines is determined as a data line, and the right one thereof is determined as a plate line, the isolation switch control signals ISTL, ISTR, ISBL, and ISBR have levels as shown in Table 1 in the reading operation.

TABLE 1

| UPPERMOST BIT OF ROW ADDRESS | LOWERMOST BIT OF COLUMN ADDRESS | ISTL | ISTR | ISBL | ISBR |
|---|---|---|---|---|---|
| 0 | 0 | H | H | H | L |
| 0 | 1 | H | H | L | H |
| 1 | 0 | H | L | H | H |
| 1 | 1 | L | H | H | H |

In Table 1, a reference character "L" indicates a "low" level, and a reference character "H" indicates a "high" level.

The bit line precharge enable signal BLN of a "high" level is changed to a "low" level, so that the grounded bit lines are in the floating states. Then, one of a plurality of word lines is selectively activated by a "high" level according to the row address applied externally. Also, the reference word line corresponding thereto is activated by a "high" level. In the case of accessing the operation memory cell of FIG. 30, the reference word line RWLBL is activated by a "high" level, and the other reference word lines RWLTL, RWLTR, and RWLBR are maintained in an inactive state of a "low" level, respectively.

In the above structure, the reference word lines can be selected according to an uppermost bit of the row address applied externally and a lowermost bit of the column address, which will be described in Table 2.

TABLE 2

| UPPERMOST BIT OF ROW ADDRESS | LOWERMOST BIT OF COLUMN ADDRESS | RWLTL | RWLTR | RWLBL | RWLBR |
|---|---|---|---|---|---|
| 0 | 0 | L | L | H | L |
| 0 | 1 | L | L | L | H |
| 1 | 0 | H | L | L | L |
| 1 | 1 | L | H | L | L |

In Table 2, a reference character "L" indicates a "low" level, and a reference character "H" indicates a "high" level. Then, one of the bit line equalizer enable signals REQT and REQB is selectively activated by a "high" level. In the case of accessing the operation memory cell 511T of FIG. 30, the bit line equalizer enable signal REQB is activated by a "high" level, and the bit line equalizer enable signal REQT is inactivated by a "low" level. Accordingly, NMOS transistors 560T0, 560T1, . . . , and 560Tm of FIG. 28 are turned off, and NMOS transistors 560B0, 560B1, . . . , and 560Bm are turned on.

The bit line equalizer enable signals REQT and REQB can be controlled as shown in Table 3 in the reading operation.

TABLE 3

| UPPERMOST BIT OF ROW ADDRESS | REQT | REQB |
|---|---|---|
| 0 | L | H |
| 1 | H | L |

In the state that the bit line equalizer enable signal REQB is activated by a "high" level, the plate voltage, for example, 5 Volts, is applied through a plate voltage line SPL. The bit line determined as a data line by a plate voltage pulse has a voltage according to a polarization state of a ferroelectric capacitor of an operation memory cell, and the bit line determined as an inversion data line has a voltage as in formula 5:

$$V_{\text{inversion data line}} \frac{2Q_R}{2C_{BL}}$$
$$\frac{Q_R}{C_{BL}}$$

where reference character $C_{BL}$ indicates capacitance of the bit line.

For example, in the case of accessing the operation memory cell 511T of FIG. 30, the bit line BLT0 has a voltage according to a polarization state of a ferroelectric capacitor of the operation memory cell. In more detail, in the case that data "1" is stored in the operation memory cell 511T, the ferroelectric capacitor in a S4 state is transferred to a state S1 through a S6 state according to a plate voltage pulse, and a charge amount corresponding to $2Q_R$ is supplied onto the bit line BLT0. Accordingly, a voltage appears as in the following formula 6:

$$V_{BLT0} \frac{2Q_R}{C_{BLT0}}$$

where reference character $C_{BLT0}$ indicates the capacitance of the bit line BLT0.

Meanwhile, in the case that data "0" is stored in the operation memory cell 511T of FIG. 30, a ferroelectric capacitor in a state S1 of FIG. 1 returns the state of S1 through a state of S6. Accordingly, since a charge amount of the bit line BLT0 determined as a data line has no change, the bit line BLT0 is maintained at a ground level.

A difference in voltage of the data line and the inversion data line is amplified by a sense amplifier. In order to activate the sense amplifier, a sense amplifier enable signal LSAEN is activated by a "high" level.

In order to output an amplified signal, one of a plurality of data input/output switch signals YSW0, YSW1, YSW2, YSW3, . . . , YSWn-1, and YSWn is selectively activated by a "high" level. In the case of accessing the operation memory cell 511T of FIG. 30, the data input/output switch signal YSW0 is activated by a "high" level, and the other data input/output switch signals are maintained in an inactive state by a "low" level. Accordingly, NMOS transistors of FIGS. 34 and 35 are turned on, to thereby connect the bit line BLT0 to the data input/output line DL and connect the bit line BLB0 to the data input/output line CDL.

Figure 37:
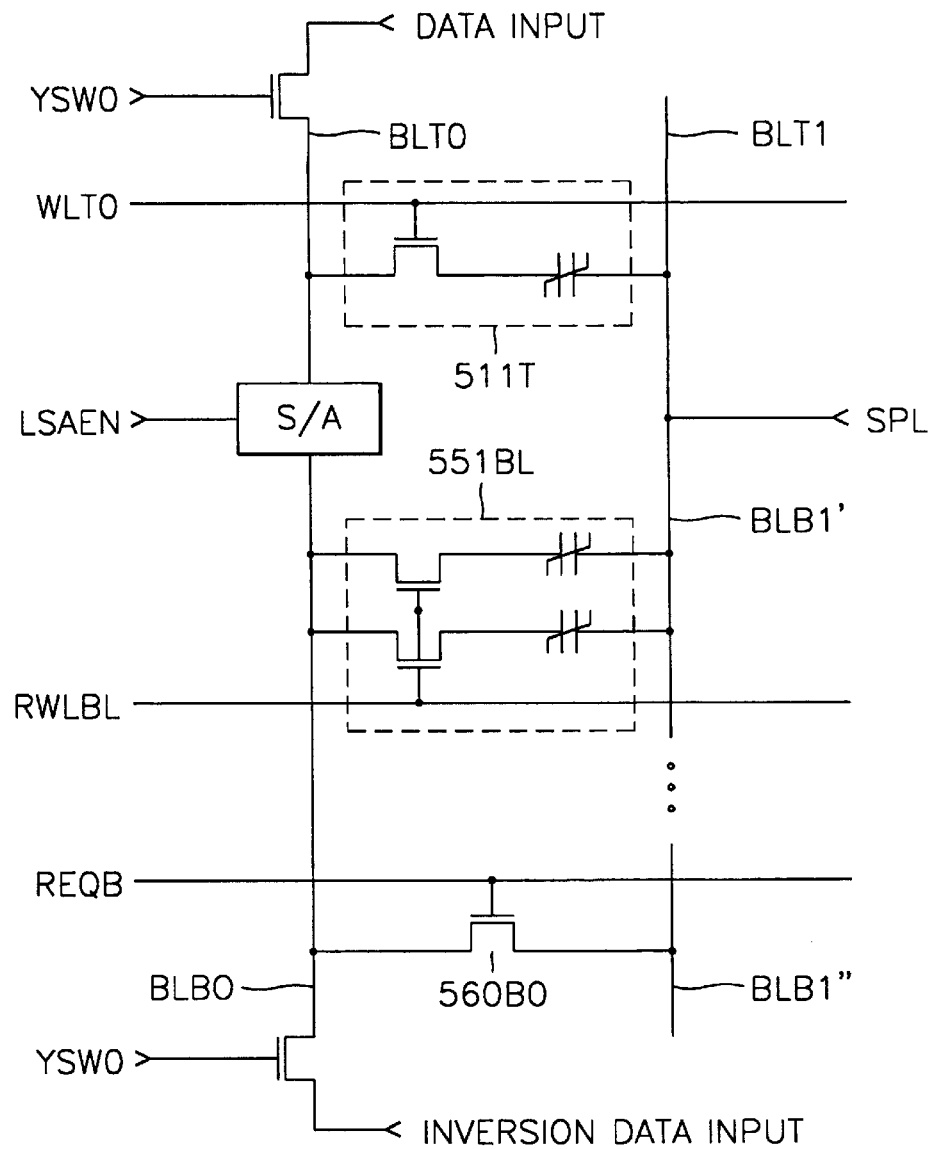
FIGS. 37 and 38 are equivalent circuit diagrams which illustrate a method of performing a reading operation on the ferroelectric memory cell array 510T of FIG. 30.

FIG. 37 is an equivalent circuit diagram for illustrating a reading operation of the operation memory cell 511T of FIG. 30. Meanwhile, in order to restore data with respect to the reference cell ferroelectric capacitors (see, e.g., reference cell 551BL), a reference cell data signal of a "high" level and an inversion reference cell data signal of a "low" level are applied to the reference cell data line RFDIN and the inversion reference cell data line RFDINB. Also, the selected reference word line RWLBL is inactivated by a "low" level. Then, one of the reference cell data gate signals RFPRST and RFPRSB is selectively activated by a "high" level. The reading operation of the reference cell data gate signals can be controlled as in Table 4.

TABLE 4

| UPPERMOST BIT OF ROW ADDRESS | RFPRST | RFPRSB |
|---|---|---|
| 0 | L | H |
| 1 | H | L |

That is, in the case of accessing the operation memory cell 511T of FIG. 30, the reference cell data gate signal RFPRSB is activated by a "high" level, to accordingly turn on transmission gates 554BL and 553BL of FIG. 25. Accordingly, reference cell data is written in the reference cell 551BL of FIG. 25.

Figure 38:
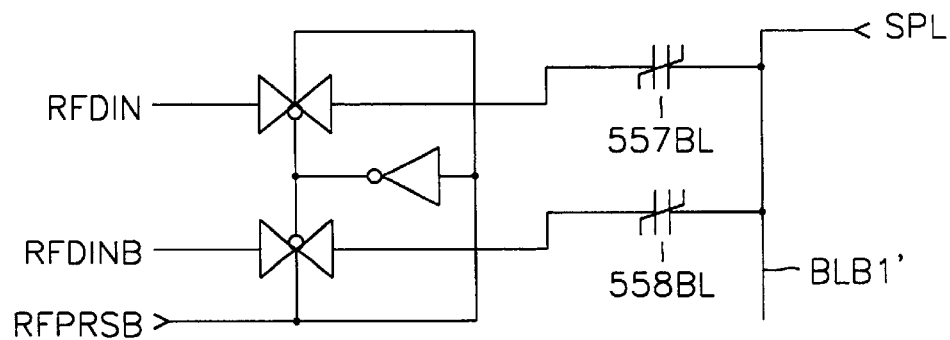

In FIG. 36, falling edges of a reference cell data signal and a reference cell inversion data signal are generated earlier than that of the reference cell data gate signal RFPRSB. Accordingly, a difference in voltage between both ends of the reference cell ferroelectric capacitors is precharged by 0 Volts. In FIG. 38, a reference cell data signal is applied to one end of a reference cell ferroelectric capacitor 557BL, and a plate voltage pulse is applied to the other end thereof. An inversion reference cell data signal is applied to one end of a reference cell ferroelectric capacitor 558BL, and a plate voltage pulse is applied to the other end thereof.

Figure 39:
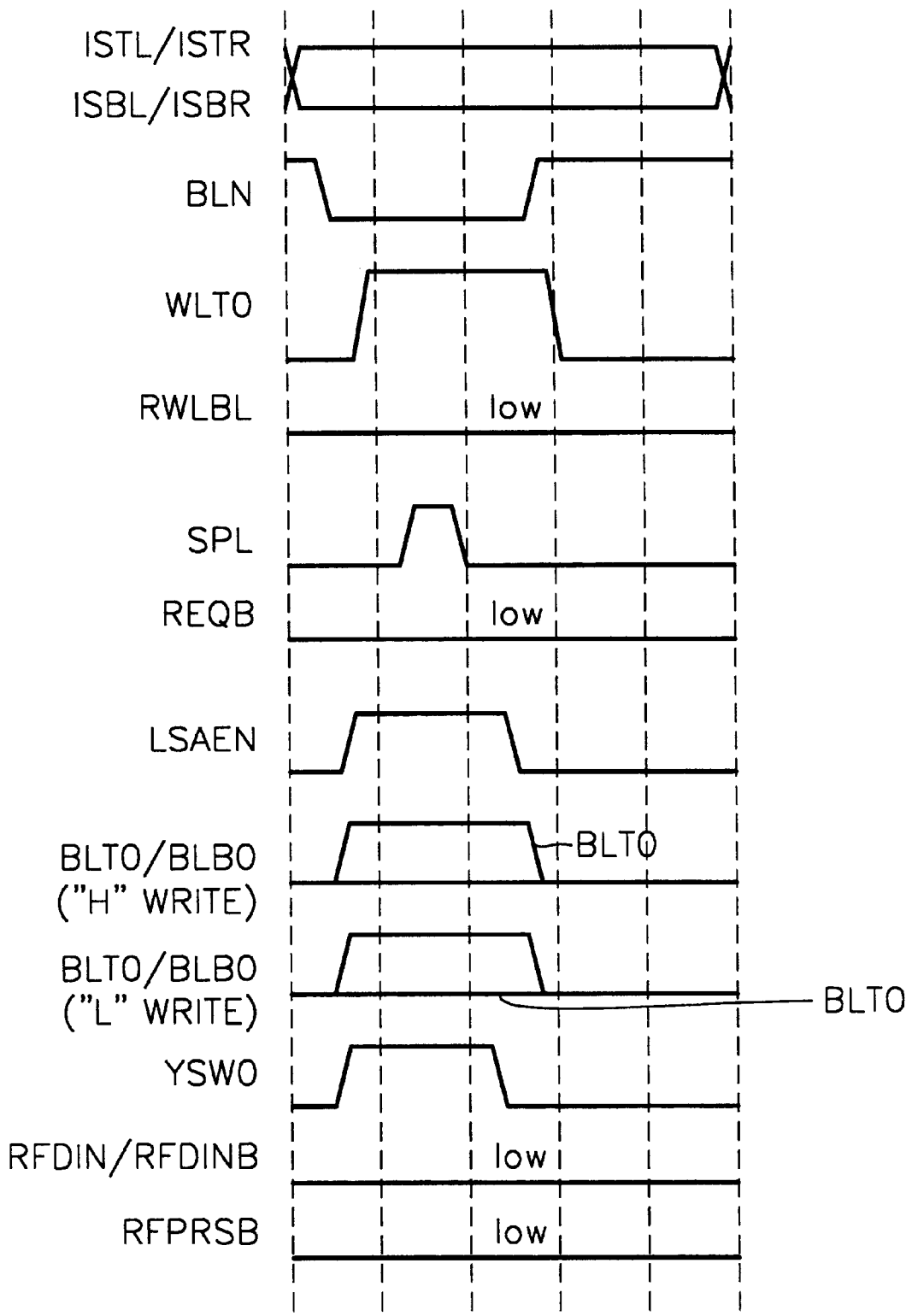
FIG. 39 is a timing diagram which illustrates a method of performing a writing operation on the memory device of FIG. 21.

FIG. 39 is a waveform diagram of a writing operation of the nonvolatile ferroelectric memory device shown in FIGS. 21 through 35. The writing operation will be described as follows. First, a data line, an inversion data line and a plate line are determined by column select signals Y0, Y1, Y2, Y3, . . . , and Yn output from a column decoder. Meanwhile, according to a row address and a column address applied externally, levels of isolation switch control signals ISTL, ISTR, ISBL and ISBR are changed. A control method thereof is the same as that of the reading operation (see Table 1).

Next, in order to float the bit lines precharged by a "high" level, a bit line precharge enable signal BLN is inactivated by a "low" level. Also, one of a plurality of data input/output switch signals is selectively activated. In the case of a writing operation of the operation memory cell 511T of FIG. 30, a data input/output switch signal YSW0 is activated by a "high" level, and the other data input/output switch signals are inactivated by a "low" level. Accordingly, a data signal and an inversion data signal which are applied through the data input/output lines DL and CDL are transmitted to bit lines BLT0 and BLB0, respectively. Then, in order to enable a sense amplifier, a sense amplifier enable signal LSAEN is activated by a "high" level. Subsequently, a selected word line is activated by a "high" level. That is, in the writing operation of the operation memory cell 511T of FIG. 30, a word line WLT0 is activated by a "high" level, and the other word lines are inactivated. In this state, a plate voltage pulse is applied to a bit line determined as a plate line. That is, a pulse of approximately 5 Volts is applied to bit lines BLT1 and BLB1'. Accordingly, a ferroelectric capacitor included in the operation memory cell 511T is programmed by a polarization state according to a data signal. Then, the data input/output switch signal YSW0 is transited to a "low" level, and a bit line precharge enable signal BLN is transited to a "high" level. Accordingly, the bit lines BLT0 and BLB0 are grounded. Also, the selected word line WLT0 becomes again a "low" level.

As shown in FIG. 39, during the writing operation, a reference word line RWLBL, a bit line equalizer enable signal REQB, and a reference cell data line/inversion reference cell data line RFDIN/RFDINB are inactivated by a "low" level. Also, the reference word lines RWLTL, RWLTR and RWLBR and a bit line equalizer enable signal REQT, which are in the inactive state during the reading operation, are maintained in an inactive state. That is, all reference cell access transistors are maintained in the turned-off states. Accordingly, the reference cells are prevented from being unnecessarily exposed to an operation cycle.

Figure 40:
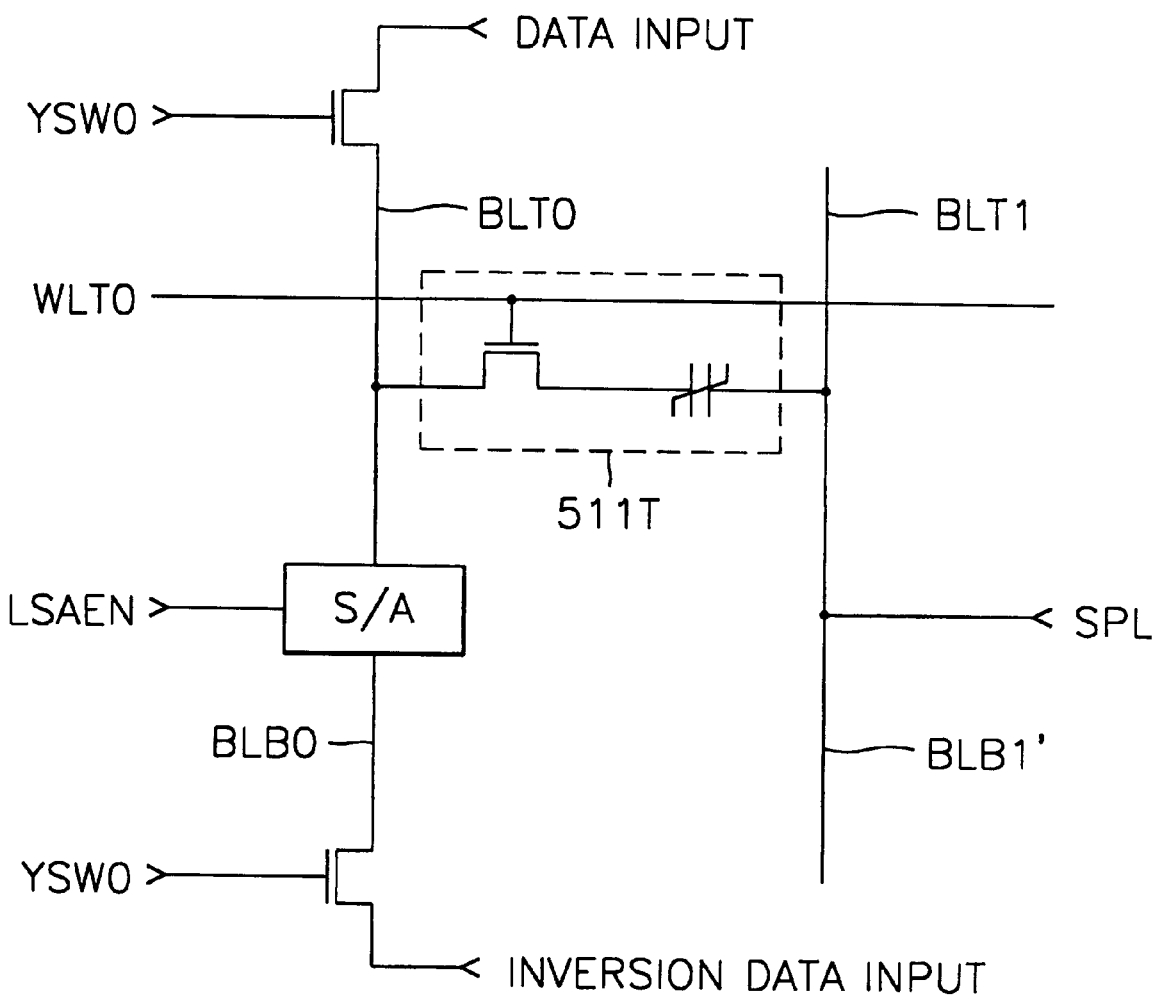
FIG. 40 is an equivalent circuit diagram which illustrates a method of performing a writing operation on the memory device of FIG. 21.

FIG. 40 is an equivalent circuit diagram for illustrating the writing operation described in FIG. 39. As shown in FIG. 40, an isolation switch control signal ISBR becomes a "low" level, to divide a bit line BLB1 into two portions BLB1' and BLB1". Accordingly, a plate voltage pulse is not applied to the operation memory cells connected to the bit line BLB1", to prevent the operation memory cells from being unnecessarily exposed to the operation cycle.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A ferroelectric random access memory device, comprising:
   a ferroelectric random access memory cell array electrically coupled to a plurality of bit lines;
   a ferroelectric reference cell array electrically coupled to the plurality of bit lines;
   a sense amplifier; and
   means, coupled to the plurality of bit lines, for configuring bit lines as plate lines by selectively electrically coupling first ones of the plurality of bit lines to the sense amplifier and second ones of the plurality of bits lines to a plate voltage line, in response to a column select signal.

2. The memory device of claim 1, further comprising:
   a bit line equalizer circuit electrically coupled to the plurality of bit lines; and
   an isolation switch circuit electrically coupled to the plurality of bit lines.

3. The memory device of claim 2, wherein the plurality of bit lines contain a plurality of first bit lines and a plurality of second bit lines; wherein the ferroelectric reference cell array comprises a plurality of ferroelectric reference cells electrically connected between a bit line in the plurality of first bit lines and a bit line in the plurality of second bit lines.

4. The memory device of claim 3, wherein the bit line equalizer circuit comprises a plurality of field effect transistors electrically connected in series, each of said plurality of field effect transistors connected between a bit line in the plurality of first bit lines and a bit line in the plurality of second bit lines.

5. The memory device of claim 4, wherein the isolation switch circuit comprises a first plurality of pass transistors that are each electrically connected in series with respective ones of the bit lines in the plurality of first bit lines and a second plurality of pass transistors that are each electrically connected in series with respective ones of the bit lines in the plurality of second bit lines.

6. The memory device of claim 4, wherein the isolation switch circuit comprises a first plurality of pass transistors that are each electrically connected in series with respective ones of the bit lines in the plurality of first bit lines and a second plurality of pass transistors that are each electrically connected in series with respective ones of the bit lines in the plurality of second bit lines.

7. The memory device of claim 6, wherein the means for configuring bit lines as plate lines comprises a third plurality of pass transistors that are each electrically connected in series between the plate line and a respective one of the bit lines in the plurality of second bit lines and a fourth plurality of pass transistors that are each electrically connected in series between the plate line and a respective one of the bit lines in the plurality of first bit lines.

8. The memory device of claim 7, wherein each of the ferroelectric reference cells comprises a pair of access transistors and a pair of ferroelectric capacitors.

9. The memory device of claim 6, wherein the means for configuring bit lines as plate lines comprises a third plurality of pass transistors that are each electrically connected in series between a respective one of the bit lines and the sense amplifier.

* * * * *